US010900927B2

(12) United States Patent
Walsh et al.

(10) Patent No.: US 10,900,927 B2
(45) Date of Patent: Jan. 26, 2021

(54) GRAPHENE FIELD EFFECT TRANSISTORS FOR DETECTION OF IONS

(71) Applicants: UNIVERSITY OF SOUTH CAROLINA, Columbia, SC (US); CLEMSON UNIVERSITY, Clemson, SC (US)

(72) Inventors: Kenneth Walsh, Blythewood, SC (US); Goutam Koley, Anderson, SC (US); Md. Sayful Islam, Griffin, GA (US); Hongmei Li, Seneca, SC (US)

(73) Assignees: University of South Carolina, Columbia, SC (US); Clemson University, Clemson, SC (US)

( * ) Notice: Subject to any disclaimer, the term of this patent is extended or adjusted under 35 U.S.C. 154(b) by 0 days.

(21) Appl. No.: 16/356,019

(22) Filed: Mar. 18, 2019

(65) Prior Publication Data
US 2019/0293595 A1    Sep. 26, 2019

Related U.S. Application Data

(60) Provisional application No. 62/645,907, filed on Mar. 21, 2018.

(51) Int. Cl.
*G01N 27/414* (2006.01)
*G01N 27/333* (2006.01)
(Continued)

(52) U.S. Cl.
CPC ......... *G01N 27/414* (2013.01); *G01N 27/308* (2013.01); *G01N 27/3335* (2013.01); *H01L 29/1606* (2013.01)

(58) Field of Classification Search
CPC ............. G01N 27/414; G01N 27/3335; G01N 27/308; G01N 27/4146; G01N 2021/775;
(Continued)

(56) References Cited

U.S. PATENT DOCUMENTS 4,361,473 A    11/1982 Young et al.
4,973,394 A    11/1990 Ross et al.
(Continued)

FOREIGN PATENT DOCUMENTS

CN    202281985    6/2012
CN    102569407    7/2012
(Continued)

OTHER PUBLICATIONS

Li et al. Graphene field effect transistors for highly sensitive and selective detection of K+ions. Publication of Clemson University, pp. 1-13 (Year: 2017).*
(Continued)

*Primary Examiner* — Galina G Yushina
(74) *Attorney, Agent, or Firm* — Dority & Manning, P.A.

(57) ABSTRACT

A graphene-based ion sensitive field effect transistor (GIS-FET) with high sensitivity and selectivity for ions is provided. For example, the GISFET of the present invention can exhibit high sensitivity and selectivity for $K^+$ ions has been demonstrated utilizing a valinomycin-based ion selective membrane. The sensitivity of the GISFET can be at least about 50 millivolts/decade and can be stable for a time period of about two months, indicating the GISFET's reliability and effectiveness for physiological monitoring.

20 Claims, 14 Drawing Sheets

(51) Int. Cl.
*G01N 27/30* (2006.01)
*H01L 29/16* (2006.01)

(58) Field of Classification Search
CPC .............. G01N 27/333; H01L 29/1606; H01L 29/66015; H01L 41/0973; H01L 41/1138; H01L 51/0558; H01L 2924/1304
See application file for complete search history.

(56) References Cited

U.S. PATENT DOCUMENTS

| | | | | |
|---|---|---|---|---|
| 5,115,016 | A * | 5/1992 | Dickens | C08K 7/14 524/449 |
| 5,411,737 | A * | 5/1995 | Hsu | A61K 9/2027 424/411 |
| 5,897,758 | A * | 4/1999 | Musacchio | G01N 27/3335 204/416 |
| 6,329,480 | B1 * | 12/2001 | Uchiumi | C08F 20/12 526/173 |
| 8,252,598 | B2 | 8/2012 | Koley et al. | |
| 8,580,099 | B2 | 11/2013 | Koley | |
| 2010/0173422 | A1 | 7/2010 | Koley et al. | |
| 2012/0001235 | A1 * | 1/2012 | Fife | G01N 27/414 257/253 |
| 2012/0068156 | A1 | 3/2012 | Koley | |
| 2012/0181510 | A1 * | 7/2012 | Avouris | H01L 27/0688 257/29 |
| 2013/0146846 | A1 | 6/2013 | Adkisson et al. | |
| 2013/0146847 | A1 | 6/2013 | Adkisson et al. | |
| 2014/0070170 | A1 | 3/2014 | Andersson et al. | |
| 2018/0321184 | A1 * | 11/2018 | MacKin | G03F 7/095 |

FOREIGN PATENT DOCUMENTS

| | | |
|---|---|---|
| CN | 202633318 | 12/2012 |
| CN | 202826614 | 3/2013 |
| CN | 103433189 | 12/2013 |
| SU | 1448264 | 12/1988 |
| WO | WO 2005/029038 | 3/2005 |

OTHER PUBLICATIONS

Hammond et al. Encapsulation of liquid-sensing microchip using SU-8 photoresist. Microelectronic Engineering, 73-74 (2004), pp. 893-897 (Year: 2004).*
Zhu et al. Application of ion-sensitive field effect transistors for measuring glial cell K+ transport. IEEE, 2016 (Year: 2016).*
Adam, et al. "A self-consistent theory for graphene transport" *Proc. Nat. Acad. Sci. USA* 104 (2007) pp. 18392-18397.
Akhavan, et al. "Toward single-DNA electrochemical biosensing by graphene nanowalls" *ACS Nano* 6(4) (2012) pp. 2904-2916.
Akturk, et al. "Electron transport and full-band electron-phonon interactions in graphene" *J. of Appl. Phys.* 103 (2008).
Andreoli, et al. "The effect of valinomycin on the ionic permeability of thin lipid membranes" *J. Gen. Physiol.* 50 (1967) pp. 2527-2545.
Andreoni, W. "The physics of fullerene-based and fullerene-related materials" vol. 23 *Springer Scient & Business Media* (2000) pp. 1-448.
Ang, et al. "Solution-gated epitaxial graphene as pH sensor" *J. Amer Chem Soc.* 130 (2008) pp. 14392-14393.
Arquint, et al. "Micromachined analyzers on a silicon chip" *Clin. Chem.* 40 (1994) pp. 1805-1809.
Avouris, et al. "Carbon-based electronics" *Nat. Nano.* 2 (2007) pp. 605-615.
Balandin, A.A. "Low-frequency 1/$f$ noise in graphene devices" *Nat. Nano.* 8 (2013) pp. 549-555.
Balandin, et al. "Superior Thermal Conductivity of Single-Layer Graphene" *Nano Lett.* 8(3) (2008) pp. 902-907.
Baringhaus, et al. "Exceptional ballistic transport in epitaxial graphene nanoribbons" *Nature* 506 (2014) pp. 349-354.

Baumann, et al. "Microelectronic sensor system for microphysiological application on living cells" *Sensors and Actuators B* 55 (1999) pp. 77-89.
Berger, et al. "Ultrathin Epitaxial Graphite: 2D Electron Gas Properties and a Route toward Graphene based Nanoelectronics" *The Journal of Physical Chemistry B* 108 (2004) pp. 19912-19916.
Bergveld, P. "Development, operation, and application of the ion-sensitive field effect transistor as a tool for electrophysiology" *IEEE Transactions on Biomedical Engineering* BME-19(5) (1972) pp. 342-351. (Abstract only).
Bergveld, P. "Development of an ion-sensitive solid-state device for Neurophysiological measurements" *IEEE Transaction on Biomedical Engineering* 1 (1970) pp. 70-71.
Bolotin, et al. "Temperature dependent transport in suspended graphene" *Phys. Rev. Lett.* 101:096802 (2008) pp. 1-4.
Boukhvalov, et al. "Chemical functionalization of graphene" *J. Phys. Condens. Matter* 21:344205 (2009) pp. 1-12.
Bousse, et al. "The influence of counter-ion adsorption on the ψ0/pH characteristics of insulator surfaces" *Surface Sci.* 135 (1983) pp. 479-496. (Abstract only).
Bratov, et al. "Recent trends in potentiometric sensor arrays: A review" *Anayltica Chimica Acta* 678 (2010) pp. 149-159.
Bratov, et al. "Ion sensor with photocurable polyurethane polymer membrane" *J. Electrochem. Soc.* 141 (1994) pp. L111-112.
Bunch, et al. "Impermeable Atomic Membranes from Graphene sheets" *Nano Lett.* 8 (2008) pp. 2458-2462.
Bunch, et al. "Electromechanical Resonators from Graphene Sheets" *Science* 315 (2007) pp. 490-493.
Caras, et al. "pH-based enzyme potentiometric sensors. Part 2. Glucose-sensitive field effect transistor" *Analytical Chemistry* 57 (1985) pp. 1920-1923.
Chaniotakis, et al. "Novel semiconductor materials for the development of chemical sensors and biosensors: A review" *Anayltica Chimica Acta* 615 (2008) pp. 1-9.
Charlier, et al. "Electron and Phonon Properties of Graphene: Their Relationship with Carbon Nanotubes" *Carbon Nanotubes, Topics Appl. Physics* 111 (2008) pp. 673-709.
Chen, et al. "A graphene field-effect capacitor sensor in electrolyte" *Appl. Phys. Lett.* 101:154106 (2012) pp. 1-5. (Abstract only).
Chen, et al. "Mobility Extraction and Quantum Capacitance Impact in High Performance Graphene Field-effect Transistor Devices" *IEEE* (2008) pp. 1-4.
Chen, et al. "Intrinsic and Extrinsic Performance Limits of Graphene Devices on $SiO_2$" *Nat. Nano.* 3 (2008) pp. 206-209.
Chen, et al. "Charged-Impurity Scattering in Graphene" *Nature Physics* 4 (2008) pp. 377-381.
Choi, et al. "Positive bias temperature instability effects of Hf-based nMOSFETs with various nitrogen and silicon profiles" *IEEE Electron Device Lett.* 26(1) (2005) pp. 32-34.
Cid, et al. "Ion sensitive field effect transistors using carbon nanotubes as the transducing layer" *Analyst* 133 (2008) pp. 1001-1004.
Clark, S. "Graphene Market by Product Type (Mono-layer & Bi-layer Graphene, Few Layer Graphene, Graphene Oxide, and Graphene Nano Platelets) and Application (RFID, Composites, Sensors, Research & Development, Energy Storage, Functional Ink, and Polymer Additives)—Global Opportunity Analysis and Industry Forecast, 2014-2021" https://www.alliedmarketresearch.com/graphene-market.
Colapicchioni, et al. "Immunoenzymatic assay using CHEMFET devices" *Sensors and Actuators B* 4 (1991) pp. 245-250. (Abstract only).
Conradie, et al. "SU-8 thick photoresist processing as a functional material for MEMS applications" *J. Micromech. Microeng.* 12 (2002) pp. 368-374.
De Heer, et al. "Large area and structured epitaxial graphene produced by confinement controlled sublimation of silicon carbide" *Proc. of the Nat. Acad. Sci.* 108(41) (2011) pp. 16900-16905.
Devinsky, et al. "Glia and epilepsy: Excitability and inflammation trends in neurosciences" *Trends Neurosci.* 36 (2013) pp. 174-184.
Dikin, et al. "Preparation and characterization of graphene oxide paper" *Nature* 448 (2007) pp. 457-460.

(56) References Cited

OTHER PUBLICATIONS

Dong, et al. "Electrical detection of DNA hybridization with single-base specificity using transistors based on CVD-grown graphene sheets" *Advance Materials* 12 (2012) pp. 1-5.
Dong, et al. "Doping single-layer graphene with aromatic molecules" *Small* 5 (2009) pp. 1422-1426.
Dresselhaus, et al. "Perspectives on carbon nanotubes and graphene Raman spectroscopy" *Nano Ltrs.* 10 (2010) pp. 751-758.
Durst, et al. "Tris/Tris—HC1: A standard buffer for use in the physiologic pH range" *Clin. Chem.* 18 (1972) pp. 206-208.
Emtsev, et al. "Towards wafer-size graphene layers by atmospheric pressure graphitization of silicon carbide" *Nat Mater.* 8 (2009) pp. 203-207.
Epoxy Technology, Inc. "EPO-TEK® Biocompatible Medical Device Grade Products" https://www.epotek.com/site/files/brochures/pdfs/medical_brochure_71.d.lowres.pdf.
Epdxy Technology, Inc. "EPO-TEK® Material Safety Data Sheets".
Esashi, et al. "Integrated micro multi ion sensor using field effect of semiconductor" *IEEE Trans Biomed Eng.* BME-25(2) (1978) pp. 184-192. (Abstract only).
Fakih, et al. "Large area graphene ion sensitive field effect transistors with tantalum pentoxide sensing layers for pH measurement at the Nernstian limit" *Appl. Phys. Lett.* 105(8):083101 (2014).
Ferrari, A.C. "Raman spectroscopy of graphene and graphite: Disorder, electron-phonon coupling, doping and nonadiabatic effects" *Solid State Commun.* 143(1) (2007) pp. 47-57.
Ferrari, et al. "Raman spectrum of graphene and graphene layers" *Physical Rev. Ltrs.* 97:187401 (2006) pp. 1-4.
Frank, et al. "Mechanical properties of suspended graphene sheets" *J. Vac. Sci. Technol. B* 25 (2007) pp. 2558-2561.
Fu, et al. "High mobility graphene ion-sensitive field-effect transistors by noncovalent functionalization" *Nanoscale* 5 (2013) pp. 12104-12110.
Fu, et al. "Graphene transistors are insensitive to pH changes in solution" *Nano Lett.* 11 (2011) pp. 3597-3600.
Geim, et al. "The rise of graphene" *Nat. Mater.* 6(3) (2007) pp. 183-191.
Ghosh, et al. "Extremely high thermal conductivity of graphene: Prospects for thermal management applications in nanoelectronics circuits" *Appl. Phys. Lett.* 92:151911 (2008) pp. 1-3.
Hammond, et al. "Encapsulation of a liquid-sensing microchip using SU-8 photoresist" *Micro Eng.* 73 (2004) pp. 893-897.
Hao, et al., "The role of surface oxygen in the growth of large single-crystal graphene on copper" *Science* 342 (2013) pp. 720-723.
He, et al. "Effect of plasticization on ionic conductivity enhancement in relation to glass transition temperature of crosslinked polymer electrolyte membranes" *Macromolecules* 49(15) (2016) pp. 5637-5648.
Heng, et al. "Methacrylic-acrylic polymers in ion-selective membranes: achieving the right polymer recipe" *Anal. Chim. Acta* 403 (2000) pp. 77-89.
Hernandez, et al. "High-yield production of graphene by liquid-phase exfoliation of graphite" *Nature Nano.* 3 (2008) pp. 563-568.
Hess, et al. "Graphene transistors arrays for recording action potentials from electrogenic cells" *Advanced Materials* 23 (2011) pp. 5045-5049.
Hess, et al. "High-transconductance graphene solution-gated field effect transistors" *Applied Physics Letters* 99:033503 (2011) pp. 1-4.
Huard, et al. "Evidence of the role of contacts on the observed electron-hole asymmetry in graphene" *Phys. Rev. B Condens. Matter* 78(12):121402 (2008) pp. 1-4.
Janata, J. "Twenty years of ion-selective field-effect transistors" *Analyst* 119 (1994) pp. 2275-2278.
Jimenez-Jorquera, et al. "ISFET based sensors: Fundamentals and Applications" *Encyclopedia of Sensors* 5 (2006) pp. 151-196.
Karimi, et al. "Capacitance Variation of Electrolyte-Gated Bilayer Graphene Based Transistors" *Journal of Nanomaterials* 2013:836315 (2013) pp. 1-5.
Ko, et al. "Implantable sensors for closed loop prosthetic systems" *Wiley-Blackwell.* (1985).
Koepke, et al. "Atomic-scale evidence for potential barriers and strong carrier scattering at graphene grain boundaries: A scanning tunneling microscopy study" *ACS Nano* 7 (2013) pp. 75-86.
Kuehn, et al. "Raman Spectroscopy—a powerful tool in gem identification" *3rd International Gem & Jewelry Conference* (2012). (Extended Abstract only).
Kuzmenko, et al. "Universal Optical Conductance of Graphite" *Phys. Rev. Lett.* 100:117401 (2008) pp. 1-4.
Lai, et al. "Subnanomolar detection limit application of ion-selective electrodes with three-dimensionally ordered macroporous (3DOM) carbon solid contacts" *J. Solid State Electrochem.* 13(1) (2009) pp. 123-128.
Leadbitter, et al. "Packaging materials: 1. Polyethylene terephthalate (PET) for food packaging applications" *Int. Life Sci. Inst.* 16 (2000) pp. 1-20.
Leblanc, et al. "Long-lived potassium ion selective polymer membrane electrode" *Anal. Chem.* 48 (1976) pp. 1658-1660.
Lee, et al. "Estimation of Young's modulus of graphene by Raman spectroscopy" *Nano Letters* 12 (2012) pp. 4444-4448.
Lee, et al. "Measurement of the Elastic Properties and Intrinsic Strength of Monolayer Graphene" *Science* 321 (2008) pp. 385-388.
Lemme, et al. "A graphene field-effect device" *IEEE Electron Device Lett.* 28(4) (2007) pp. 282-284.
Li, et al. "Evolution of Graphene Growth on Ni and Cu by Carbon Isotope Labeling" *Nano Letters* 9 (2009) pp. 4268-4272.
Liang, et al. "Performance Projections for Ballistic Graphene Nanoribbon Field-Effect Transistors" *IEEE Trans. Elecfron Dev.* 54 (2007) pp. 677-682.
Libertino, et al. "Biosensor integration on Si-based devices: Feasibility studies and examples" *Sens. Actuators B* 179 (2013) pp. 240-251.
Lin, et al. "100-GHz transistors from wafer-scale epitaxial graphene" *Science* 327(5966) (2010) p. 662.
Liu, et al. "Bias Temperature Instability (BTI) characteristics of graphene field-effect transistors" *IEEE Proc. VLSI-TSA* (2011) pp. 1-2. (Abstract only).
Malard, et al. "Raman spectroscopy in graphene" *Phys. Rep.* 473 (2009) pp. 51-87.
Masadome, et al. "Evaluation of effect of additive salts on response of potassium-selective neutral carrier based electrodes using ion-sensitive field-effect transistor" *Anal. Commun.* 34 (1997) pp. 389-390.
Mattevi, et al. "A review of chemical vapour deposition of graphene on copper" *Journal of Materials Chemistry* 21 (2011) pp. 3324-3334.
Mingo, et al. " Carbon Nanotube Ballistic Thermal Conductance and Its Limits" *Phys. Rev. Lett.* 95:096105 (2005).
Morozov, et al. "Giant intrinsic carrier mobilities in graphene and its bilayer" *Phys. Rev. Lett.* 100(1):016602 (2008) pp. 1-4.
Moss, et al. "Potassium ion-sensitive field effect transistor" *Analytical Chemistry* 47 (1975) pp. 2238-2243.
Muñoz, et al. "Review of CVD Synthesis of Graphene" *Chemical Vapor Deposition* 19 (2013) pp. 297-322.
Nair, et al. "Fine Structure Constant Defines Visual Transparency of Graphene" *Science* 320 (2008) pp. 1308, 1-7 Supplementary.
Newaz, et al. "Probing charge scattering mechanisms in suspended graphene by varying its dielectric environment" *Nature Communication* 3:734 (2011) pp. 1-6.
Ni, et al. "The effect of vacuum annealing on graphene" *J. Raman Spectrosc.* 41(5) (2009) pp. 479-483.
Nikkhoo, et al. "Rapid detection of E. coli bacteria using potassium-sensitive FETs in CMOS" *IEEE Trans. Biomed. Circuits Syst.* 7 (2013) pp. 621-630.
Novoselov, et al. "Room-temperature quantum Hall effect in grapheme" *Science* 315 (2007) p. 1379.
Novoselov, et al. "A Two-dimensional gas of massless Dirac fermions in grapheme" *Nature* 438 (2005) p. 197.
Novoselov, et al. "Two dimensional atomic crystals" *Proc. Natl Acad. Sci. USA* 102 (2005) pp. 10451-10453.
Novoselov, et al. "Electric field effect in atomically thin carbon films" *Science* 306(5696) (2004) pp. 666-669.

(56) References Cited

OTHER PUBLICATIONS

Ohno, et al. "Electrolyte-gated graphene field-effect transistors for detecting pH and protein adsorption" *Nano Letter* 9 (2009) pp. 3318-3322.
Park, et al. "Chemical methods for the production of graphenes" *Nature Nanotechnology* 4 (2009) pp. 217-224.
Qi, et al. "The crystal orientation relation and macroscopic surface roughness in hetero-epitaxial graphene grown on Cu/mica" *Nanotechnology* 25:185602 (2014) pp. 1-7.
Rana, F. "Graphene Terahertz Plasmon Oscillators" *IEEE Trans. Nanotechnol.* 7(1) (2008) pp. 91-99.
Rollings, et al. "Synthesis and characterization of atomically thin graphite films on a silicon carbide substrate" *Journal of Physics and Chemistry of Solids* 67 (2006) pp. 2172-2177.
Rose, et al. "Stability of sodium and potassium complexes of valinomycin" *Biochim. Biophys. Acta* 72 (1974) pp. 426-435.
Rubart, et al. "Mechanisms of sudden cardiac death" *J. Clin. Invest.* 115 (2005) pp. 2305-2315.
Saito, et al. "Physical properties of carbon nanotubes" *World Scientific* (1998).
Schedin, et al. "Detection of individual gas molecules adsorbed on graphene" *Nat. Mater.* 6 (2007) pp. 652-655.
Schmidt, C. "Bioelectronics: The bionic material" *Nature* 483(7389) (2012).
Schroder, D.K. "Semiconductor material and device characterization" *John Wiley & Sons* (2006).
Schwartz, et al. "Flexible polymer transistors with high pressure sensitivity for application in electronic skin and health monitoring" *Nat. Commun.* 4:1859 (2013) pp. 1-8.
Schwierz, F. "Graphene transistors" *Nature Nanotechnology* 5(7) (2010) pp. 487-496.
Semenoff, G.W. "Condensed-Matter Simulation of a Three-Dimensional Anomaly" *Phys. Rev. Lett.* 53(26) (1984) pp. 2449-2452.
Shivaraman, et al. "Thickness Estimation of Epitaxial Gmphene on SiC Using Attenuation of Substrate Raman Intensity" *Journal of Electronic Materials* 38 (2009) pp. 725-730.
Singh, et al. "Tunable reverse-biased graphene/silicon heterojunction Schottky diode sensor" *Small* 10 (2014) pp. 1555-1565.
Singh, et al. "Electrically tunable molecular doping of graphene" *Applied Phys. Lett.* 102:043101 (2013) pp. 1-5.
Soldano, et al. "Production, properties and potential of graphene" *Carbon* 48 (2010) pp. 2127-2150.
Sprossler, et al. "Electrical recordings from rat cardiac muscle cells using field effect transistors" *Physical Review E* 60 (1999) pp. 2171-2176. (Abstract only).
Topkar, et al. "Effect of electrolyte exposure on silicon dioxide in electrolyte-oxide-semiconductor structures" *Thin Solid Films* 232 (1993) pp. 265-270. (Abstract only).

Truong, et al. "Reduced graphene oxide field-effect transistor with indium tin oxide extended gate for proton sensing" *Curr. Appl. Phys.* 14 (2014) pp. 738-743.
Uddin, et al. "Effect of epoxy exposure on the electronic properties of graphene" *J. Phys. D: Appl. Phys.* 49 (2016) pp. 1-16.
Uddin, et al. "Mobility enhancement in graphene transistors on low temperature pulsed laser deposited boron nitride" *Appl. Phys. Lett.* 107:203110 (2010) pp. 1-5.
Uddin, et al. "Functionalized graphene/silicon chemi-diode $H_2$ sensor with tunable sensitivity" *Nanotechnology* 25:125501 (2014) pp. 1-9.
Uesugi, et al. "Electric double-layer capacitance between and ionic liquid and few-layer graphene" *Nature Scientific Report* 3:1595 (2013) pp. 1-5.
Van Der Wal, et al. "Reinhoudt, Impedance spectroscopy and surface study of potassium-selective silicone rubber membranes" *J. Electroanal. Chem. Interfacial Elecfrochem.* 317 (1991) pp. 153-168.
Walsh, et al. "Application of ion-sensitive field effect transistors for ion channel screening" *Biosens. Bioelectron.* 54 (2014) pp. 448-454.
Wang, et al. "Oxide-on-graphene field effect bio-ready sensors" *Nano Res.* 7 (2014) pp. 1263-1270.
Wang, et al. "Quantitative analysis of graphene doping by organic molecular charge transfer" *Journal of Physical Chemistry C* 115 (2011) pp. 7596-7602.
Williams, et al. "Quantum Hall Effect in a Gate-Controlled p-n Junction of Graphene" *Science* 317 (2007) pp. 638-641.
Wu, et al. "Top-gated graphene field effect-transistors formed by decomposition of SiC" *Applied Physics Letters* 92:092102 (2008) pp. 1-3.
Yan, et al. "Polycrystalline silicon ISFETs on glass substrate" *Sensors* 5 (2005) pp. 293-301.
Ye, et al. "Accessing the transport properties of graphene and its multilayers at high carrier density" *Proc. Natl. Acad. Sci. USA* 108 (2011) pp. 13002-13006.
Yin, et al. "Study of indium tin oxide thin film for separative extended gate ISFET" *Mater. Chem. Phys.* 70 (2001) pp. 12-16.
Zafar, et al. "Charge trapping related threshold voltage instabilities in high permittivity gate dielectric stacks" *J. Appl. Phys.* 93(11) (2003) pp. 9298-9303. (Abstract only).
Zhang, et al. "Experimental observation of the quantum Hall effect and Berry's phase in graphene" *Nature* 438:7065 (2005) pp. 201-204.
Zhang, et al. "Positive bias temperature instability in MOSFETs" *IEEE Trans. Electron Devices* 45(1) (1998) pp. 116-124. (Abstract only).
Zhao, et al. "PBTI relaxation dynamics after AC vs. DC stress in high-K/metal gate stacks" *IEEE Int. Rel. Phys. Symp.* (2010) pp. 50-54. (Abstract only).

\* cited by examiner

GRAPHENE FIELD EFFECT TRANSISTORS FOR DETECTION OF IONS

RELATED APPLICATIONS

The present application claims priority to U.S. Provisional Patent Application No. 62/645,907, filed on Mar. 21, 2018, the entire contents of which are incorporated herein by reference.

STATEMENT AS TO RIGHTS TO INVENTIONS MADE UNDER FEDERALLY SPONSORED RESEARCH

This invention was made with Government support under Grant No. CBET-1606882 and Grant No. CBET-1029346, both awarded by the National Science Foundation. The Government has certain rights in the invention.

BACKGROUND

Sensors based on graphene, exploiting its outstanding material properties, including remarkably high charge carrier mobility, very high surface to volume ratio, and very low Johnson noise, are currently of strong technological interest in chemical, electrical, environmental, and biosensing applications since the adsorbed molecules can readily affect its conductivity through charge transfer. Graphene, being essentially a surface, is extremely sensitive to changes in surface charge, or interaction with ionic adsorbates, presenting itself as an excellent material to develop ion sensitive field effect transistors (ISFETs). The vast majority of the ISFETs demonstrated so far focus on the detection of W ions utilizing various surface functionalization layers. Although somewhat more challenging, due to the requirement of selective functionalization layers, detection of metal ions (especially those of alkali metals such as lithium, sodium, potassium, etc. and alkaline earth metals such as magnesium, calcium, etc.) are of high significance due to their important role in cell physiological processes. Meanwhile, detection of transition metal ions (such as those of cadmium) can be useful in environmental toxicology applications.

For instance, elevations in biological levels of $K^+$ ions precede the onset of sudden cardiac death, epileptic seizures and other clinical problems. However, the time course and magnitude of these changes in extracellular $K^+$ ions is yet unknown. Therefore, the development of implantable $K^+$-sensitive sensor devices could be of great use in predicting the onset of myocardial infarctions and seizures. In addition, ISFETs could present a noninvasive and biocompatible technology for measuring $K^+$ efflux from primary and stem-cell derived cells that are used for toxicological and drug discovery testing. Si-based ISFETs are already commercially available, although they suffer from several drawbacks. One of the major challenges with the Si-based ISFETs is that ions (i.e. H+, OH−) typically migrate into the oxide (accumulating at the $SiO_2$/Si interface) and change the threshold voltage of the FET, leading to their degradation over time with repeated usage.

As such a need exists for an improved ISFET that is stabile yet that still exhibits high selectivity for the ion that the ISFET is designed to detect. The present inventors have found that graphene offers an excellent opportunity to address this limitation of Si-based ion sensors in that graphene provides a surface that is impervious to ions. Even more significantly, graphene synthesized by chemical vapor deposition (CVD) on copper foil can be transferred to various substrates of choice (including but not limited to than $SiO_2$/Si), which helps to avoid this issue of ion accumulation and associated device degradation completely. In addition, the present inventors have found that the ISFETs contemplated by the present invention can be fabricated in such a manner that the ion-selective membrane is highly stable on the graphene layer. In addition, the present inventors have found that the ISFETs of the present invention can be incorporated into an array such that multiple parameters can be tested with a single test apparatus and solution, allowing for high throughput analysis for drug screening and toxicity assays. Additionally or alternately, the array can enable mapping out the $K^+$ ion spatial concentration variation in real time.

SUMMARY OF THE INVENTION

Objects and advantages of the invention will be set forth in part in the following description, or may be obvious from the description, or may be learned through practice of the invention. The invention will be described in greater detail below by reference to embodiments thereof illustrated in the figures.

In one particular embodiment of the present invention, a graphene ion selective field effect transistor (GISFET) is provided. The ion sensitive field effect transistor includes a substrate; a graphene film disposed on the substrate; and an ion selective membrane disposed on the graphene film, where the ion selective membrane comprises an ionophore, a lipophilic salt, and a polymer having a molecular weight ranging from about 100,000 Daltons to about 200,000 Daltons.

In one embodiment, the polymer can have a glass transition temperature ranging from about −20° C. to about −60° C.

In another embodiment, the polymer can be a block copolymer having a continuous amorphous phase and a discontinuous crystalline phase. Further, the continuous amorphous phase can include n-butyl acrylate and the discontinuous crystalline phase can include methyl methacrylate. In addition, the n-butyl acrylate can be present in the polymer in an amount ranging from about 82 wt. % to about 97.5 wt. % and the methyl methacrylate can be present in the polymer in an amount ranging from about 2.5 wt. % to about 18 wt. %.

In yet another embodiment, the ion selective membrane is selective for potassium ions, sodium ions, calcium ions, or cadmium ions. For example, the ion selective membrane can be selective for potassium ions, and, in such an embodiment, the ionophore can include valinomycin.

In still another embodiment, the lipophilic salt can include potassium tetrakis (4-chlorophenyl) borate (K-TCPB), sodium tetrakis (4-fluorophenyl) borate, sodium tetraphenyl borate, ammonium tetrakis (chlorophenyl) borate, or a combination thereof.

In one more embodiment, the ionophore can be present is present in an amount ranging from about 0.5 wt. % to about 4 wt. % of the total weight of the ion selective membrane.

In an additional embodiment, the lipophilic salt can be present in an amount ranging from about 0.1 wt. % to about 0.5 wt. % of the total weight of the ion selective membrane.

In one embodiment, the polymer can be present in an amount ranging from about 95 wt. % to about 99 wt. % of the total weight of the ion selective membrane.

In another embodiment, the ion selective membrane can have a thickness ranging from about 0.25 micrometers to about 20 micrometers.

In yet another embodiment, the graphene ion selective field effect transistor can include a source contact and a drain contact, where the substrate, the graphene film, the source contact, and the drain contact are encapsulated, leaving a portion of the ion sensitive membrane exposed for receiving a test solution.

In still another embodiment, the graphene ion selective field effect transistor can be stable for at least two months.

In yet another embodiment, the graphene ion selective field effect transistor can detect ions at concentrations ranging from about 0.5 micromolar to about 20 millimolar.

In one more embodiment, the graphene ion selective field effect transistor can exhibit an ion sensitivity of at least about 50 millivolts/decade.

In an additional embodiment, the substrate can include silicon, polyethylene terephthalate (PET), polyethylene naphthalate (PEN), polyether ether ketone (PEEK), polyimide (PI), or a combination thereof.

In another particular embodiment, ion sensing device is contemplated that includes the graphene ion selective field effect transistor as described above, where the graphene ion selective field effect transistor is mounted onto a printed circuit board.

In an additional embodiment, an array that includes at least two of the graphene ion selective field effect transistors (GISFETS) as described above is provided.

In one more embodiment, a method of forming the graphene ion selective field effect transistor as described above is provided. The method includes positioning the graphene film on the substrate; depositing a source contact and a drain contact on the graphene film; coating a solution containing the ionophore, the lipophilic salt, and the polymer onto the graphene film to form the ion selective membrane; and encapsulating the graphene ion selective field effect transistor, where a portion of the ion selective membrane is exposed.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention to one skilled in the art, including the best mode thereof, is set forth more particularly in the remainder of the specification, including reference to the accompanying figures, in which.

Figure 1:
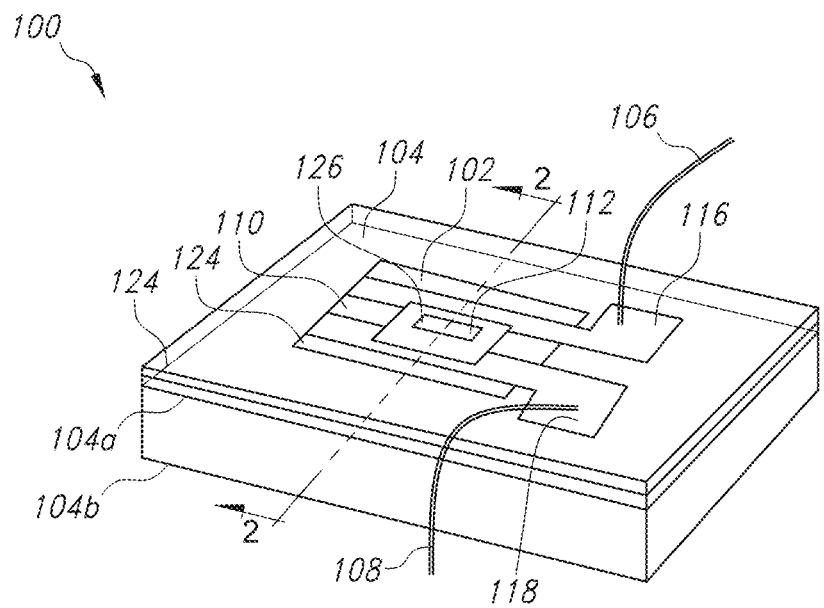
FIG. 1 illustrates a perspective view of a graphene ion sensitive field effect transistor (GISFET) contemplated by the present invention.

Repeat use of reference characters in the present specification and drawings is intended to represent the same or analogous features or elements of the present invention.

DETAILED DESCRIPTION

Reference now will be made to the embodiments of the invention, one or more examples of which are set forth below. Each example is provided by way of an explanation of the invention, not as a limitation of the invention. In fact, it will be apparent to those skilled in the art that various modifications and variations can be made in the invention without departing from the scope or spirit of the invention. For instance, features illustrated or described as one embodiment can be used on another embodiment to yield still a further embodiment. Thus, it is intended that the present invention cover such modifications and variations as come within the scope of the appended claims and their equivalents. It is to be understood by one of ordinary skill in the art that the present discussion is a description of exemplary embodiments only, and is not intended as limiting the broader aspects of the present invention, which broader aspects are embodied exemplary constructions.

Generally speaking, the present invention is directed to graphene-based ion sensitive field effect transistor (GISFET) with high sensitivity and selectivity for ions, where the GISFET can maintain its stability of a time frame of at least two months based on the specific combination of components (e.g., ionophore, polymer, and lipophilic salt) in the ion selective membrane portion of the GISFET. For example, in one particular embodiment, the GISFET of the present invention can exhibit high sensitivity and selectivity for $K^+$ ions utilizing an ion selective membrane (ISM) that includes valinomycin as an ionophore, a high molecular weight block copolymer as the polymer, and potassium tetrakis (4-chlorophenyl) borate (K-TCPB) as the lipophilic salt. The sensitivity of the GISFET can be at least about 50 millivolts/decade and, as mentioned above, can be stable for a time period of two months or more, indicating the GISFET of the present invention's reliability and effectiveness for physiological monitoring.

Figure 2:
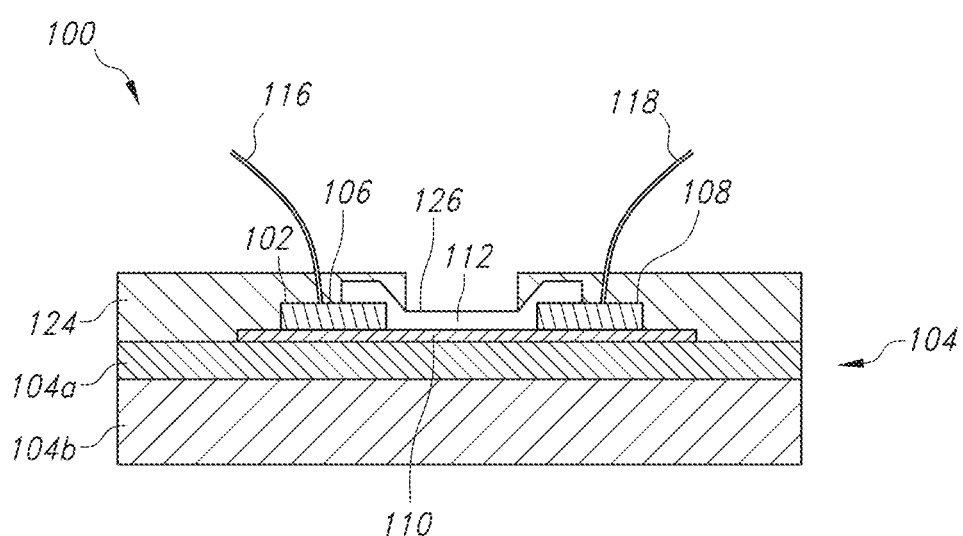
FIG. 2 illustrates a cross-sectional view of the GISFET of FIG. 1, taken at line 2-2.

Referring now to FIGS. 1-4, the various features of the GISFET and the system/device in which it is contained are discussed in more detail. As shown in the perspective view of FIG. 1 and the cross-sectional view of FIG. 2 taken at line 2-2 in FIG. 1, the graphene ion selective field effective transistor 100 includes a graphene film 102 disposed on a substrate 104. The substrate 102 can be any suitable substrate material. In FIGS. 1 and 2, the substrate 104 can include an insulator layer 104a (e.g., silicon dioxide ($SiO_2$)) disposed between the graphene film 102 and the substrate material 104b (e.g., silicon $n^+$ doped), although it is to be understood that the substrate 104 can include any other material, such as a flexible polymer. The flexible polymer can also have low toxicity and be chemically inert such that the graphene ion selective field effect transistor 100 can be used in biosensing applications. For instance, the substrate 104 can include a polymer such as polyethylene terephthalate (PET), polyethylene naphthalate (PEN), polyether ether ketone (PEEK), polyimide (PI), or a combination thereof.

Regardless of the particular material from which the substrate 104 is formed, the graphene film 102 can be disposed on an upper surface of the substrate 104, after which a source contact 106 and a drain contact 108 can be disposed on the graphene film 102, thus forming a graphene channel 110. The source contact 106 and the drain contact 108 can be formed of one or more metals. In one particular embodiment, the source contact 106 and the drain contact 108 can include titanium (Ti) and nickel (Ni). For instance, the source contact 106 and the drain contact 108 can include a first layer of Ti having a thickness ranging from about 10 nanometers to about 50 nanometers, such as from about 15 nanometers to about 45 nanometers, such as from about 20 nanometers to about 40 nanometers, and a second layer of Ni having a thickness ranging from about 100 nanometers to about 200 nanometers, such as from about 125 nanometers to about 175 nanometers, such as from about 140 nanometers to about 160 nanometers. As shown in FIGS. 1-4, a source wire 116 and a drain wire 118 can be connected to the source contact 106 and the drain contact 108, respectively, for connection to a source contact pad 120 and a drain contact pad 122 present on a printed circuit board 114, where the contact pads 120 and 122 are then connected to a source measurement unit (SMU) 140 for ion detection. The source wire 116 and drain wire 118 can be formed of a metal such as gold.

Meanwhile, as shown in FIGS. 1-2, the ion selective membrane 112 is disposed above the graphene channel 110 and can include a single ionophore specific to the ion to be detected, a corresponding lipophilic salt, and a polymer. The ISM can have a thickness ranging from about 0.25 micrometers to about 20 micrometers, such as from about 0.5 micrometers to about 15 micrometers, such as from about 1 micrometer to about 10 micrometers. An active sensing window 126 for receiving a test solution to be detected for its ion concentration is formed by encapsulating the GISFET 100 with an encapsulant material 124 but ensuring that the active sensing area 126 is exposed and not coated with the encapsulating material 124. Although any suitable encapsulating material 124 can be used, in one particular embodiment, the encapsulating material 124 can be an epoxy-based resin.

Turning now to the specific components of the ISM 112, the ionophore can be selected depending on the specific ion that the GISFET device 101 is designed to detect via the GISFET 100. In one particular embodiment, when the GISFET is configured to detect potassium ions ($K^+$), the ionophore can include valinomycin. On the other hand, the ionophore can be monensin when the GISFET is configured to detection sodium ions ($Na^+$), the ionophore can be cadmium ionophore I when the GISFET is configured to detection cadmium ions ($Cd^{2+}$), and the ionophore can be calcium ionophore V when the GISFET is configured to detection calcium ions ($Ca^{2+}$).

Regardless of the particular ion to be detected, the ISM 112 can include a lipophilic salt, where at least one of the anion and the cation are lipophilic. Examples of lipohilic salts that can be used in the ISM of the present invention where the lipophilic species is anionic include potassium tetrakis (4-chlorophenyl) borate (K-TCPB), sodium tetrakis (4-fluorophenyl) borate, sodium tetraphenyl borate, ammonium tetrakis (chlorophenyl) borate, or a combination thereof. Further quaternary borate salts of the formula $X^+B$ $(R^1R^2R^5R^4)^-$ where $B(RR^2R^3R^4)^-$ is a lipophilic borate anion, and $X^+$ is a hydrophilic cation can also be used. In one particular embodiment, the ISM 112 of the GISFET 100 can include valinomycin as the ionophore and potassium tetrakis (4-chlorophenyl) borate (K-TCPB) as the lipophilic salt for detecting potassium ions ($K^+$). Without intending to be limited by any particular theory, the present inventors have found that the mobile cation exchange sites of the lipophilic salt can reduce the membrane resistance and activation barrier for the cation-exchange reaction at the ISM/test solution interface, thus reducing the ionic interference significantly and thereby increasing the ion-detection sensitivity of the GISFET device 101.

The polymer in the ISM can also be specifically selected to enhance the sensitivity and stability of the GISFET device. In one particular embodiment, the polymer can be a copolymer having a high molecular weight. For instance, the polymer can have a molecular weight ranging from about 100,000 Daltons to about 200,000 Daltons, such as from about 125,000 Daltons to about 175,000 Daltons, such as from about 140,000 Daltons to about 160,000 Daltons. Further, the copolymer can be a two-phase system having a continuous amorphous phase and a discontinuous crystalline phase that cross-links the polymer. For instance, the copolymer can be a block copolymer including monomers of n-butyl acrylate in the continuous phase and methyl methacrylate in the discontinuous phase. Further, the n-butyl acrylate can be present in the copolymer in an amount ranging from about 82 wt. % to about 97.5 wt. %, such as from about 85 wt. % to about 95 wt. %, such as from about 87.5 wt. % to about 92.5% based on the total weight of the polymer, while the methyl methacrylate can be present in an amount ranging from about 2.5 wt. % to about 18 wt. %, such as from about 5 wt. % to about 15 wt. %, such as from about 7.5 wt. % to about 12.5 wt. % based on the total weight of the copolymer. Further, the resulting block copolymer can have a low glass transition temperature that can range from about −20° C. to about −60° C., such as from about −25° C. to about −55° C., such as from about −30° C. to about −50° C., where such a low glass transition temperature facilitates easy ion transportation across the ISM 112 towards the graphene film 102. In addition, the copolymer can be self-plasticized. As such, the ISM 112 of the present invention is free of a separate plasticizer.

The weight percentage of the various ISM 112 components (e.g., the ionophore, the lipophilic salt, and the polymer) can be specifically controlled to achieve the desired ion selectivity and stability. For instance, the ionophore can be present in an amount ranging from about 0.5 wt. % to about 4 wt. %, such, as from about 1 wt. % to about 3.5 wt. %, such as from about 1.5 wt. % to about 43 wt. % of the total weight of the ion selective membrane. Further, the lipophilic salt can be present in an amount ranging from about 0.1 wt. % to about 0.5 wt. %, such as from about 0.15 wt. % to about 0.4 wt. %, such as from about 0.2 wt. % to about 0.3 wt. % of the total weight of the ion selective membrane. In addition, the polymer can be present in an amount ranging from about 95 wt. % to about 99 wt. %, such as from about 96 wt. % to about 98.5 wt. %, such as from about 97 wt. % to about 98 wt. % based on the total weight of the ion selective membrane.

Without intending to be limited by any particular theory, the present inventors have found that the specific components and the respective weight percentages of the components in the ISM 112 of the present invention results in the formation of an ISM having all of the necessary attributes for a highly sensitive, selective, and reliable non-plasticized polymeric ISM for biomedical and solid-state microfabrication ion sensors. For instance, the GISFET device 101 of the present invention is capable of detecting ions at concentrations ranging from about 0.5 micromolar (µM) to about 30 millimolar (mM), such as 0.75 µM to about 25 mM, such as from about 1 µM to about 20 mM. Further, the GISFET device 101 of the present invention exhibits an ion sensitivity of at least 50 millivolts/decade (mV/dec), such as from about 50 mV/dec to about 100 mV/dec, such as from about 55 mV/dec to about 75 mV/dec, where such sensitivity levels can be achieved for a time frame of at least 2 months, indicating the enhanced stability of the GISFETs contemplated by the present invention. Further, in another embodiment, the GISFET device 101 of one particular embodiment of the present invention is not sensitive to millimolar concentrations of $Na^+$ and $Ca^{2+}$, although depending on the specific ionophore utilized, another GISFET device 101 of the present invention may be sensitive to such ions.

A method for forming the GISFET 100 and GISFET device 101 on which it is used will now be discussed in more detail. First, the graphene film 102 can be synthesized using chemical vapor deposition (CVD) in a semi-automated quartz tube furnace system, where monolayer, uniform graphene over a large area can be grown on, for instance, a metal foil such as a copper foil, where the foil can act as both a substrate and catalyst. The metal foil can then be annealed at a temperature ranging from about 900° C. to about 1100° C. for a time frame ranging from about 30 minutes to about 4 hours under a continuous flow of $H_2$ and Ar gases prior to graphene film 102 growth, which can be followed by the graphene growth at a temperature ranging from about 950° C. to about 1150° C. for a time frame ranging from about 5 minutes to about 30 minutes under a continuous flow of methane.

Next, the graphene film 102 synthesized on the foil can be removed from the foil and used to fabricate a GISFET device 100 as contemplated by the present invention. First, the foil on which the graphene film 102 is disposed can be coated with a polymer (e.g., polymethyl methacrylate (PMMA)) using a spin coater and can then be baked for a time frame ranging from about 15 seconds to about 2 minutes at a temperature ranging from about 125° C. to about 175° C. Next, the graphene film 102 on the back side of the foil can be removed by oxygen plasma etching, after which the metal (e.g., copper) can be etched in ammonium persulfate solution for a time period ranging from about 1 hour to about 4 hours, releasing the graphene film 102/PMMA top layer. After rinsing in deionized water, the graphene film 102/PMMA layer can be transferred and placed on the desired substrate 104 in isopropyl alcohol and allowed to dry for a time frame ranging from about 5 minutes to about 30 minutes. Finally, the substrate 104/graphene film 102/PMMA layer can be soaked in acetone for a time frame ranging from about 1 hour to about 4 hours to remove the PMMA. Next, to fabricate the GISFET 100, source and drain contacts 106 and 108 can be deposited on the transferred graphene film 102 using an electron beam evaporator, with the contact areas 106 and 108 defined by a metal mask, forming a graphene channel 110.

Next, a solution containing the desired ionophore, lipophilic salt, and polymer can be coated onto the graphene film 102 to form the ISM 112 and kept at room temperature for a time period ranging from about 10 minutes to about 30 minutes for complete solvent volatilization and stable ISM 112 formation. In one particular embodiment, the solution can include a solvent such as tetrahydrofuran, where the soluble components that ultimately form the ISM 112 (e.g., the ionophore, lipophilic salt, and polymer) are present at a concentration ranging from about 100 mg/mL to about 300 mg/mL, such as 140 mg/mL to about 240 mg/mL, such as from about 180 mg/mL to about 200 mg/mL of solvent.

Figure 4:
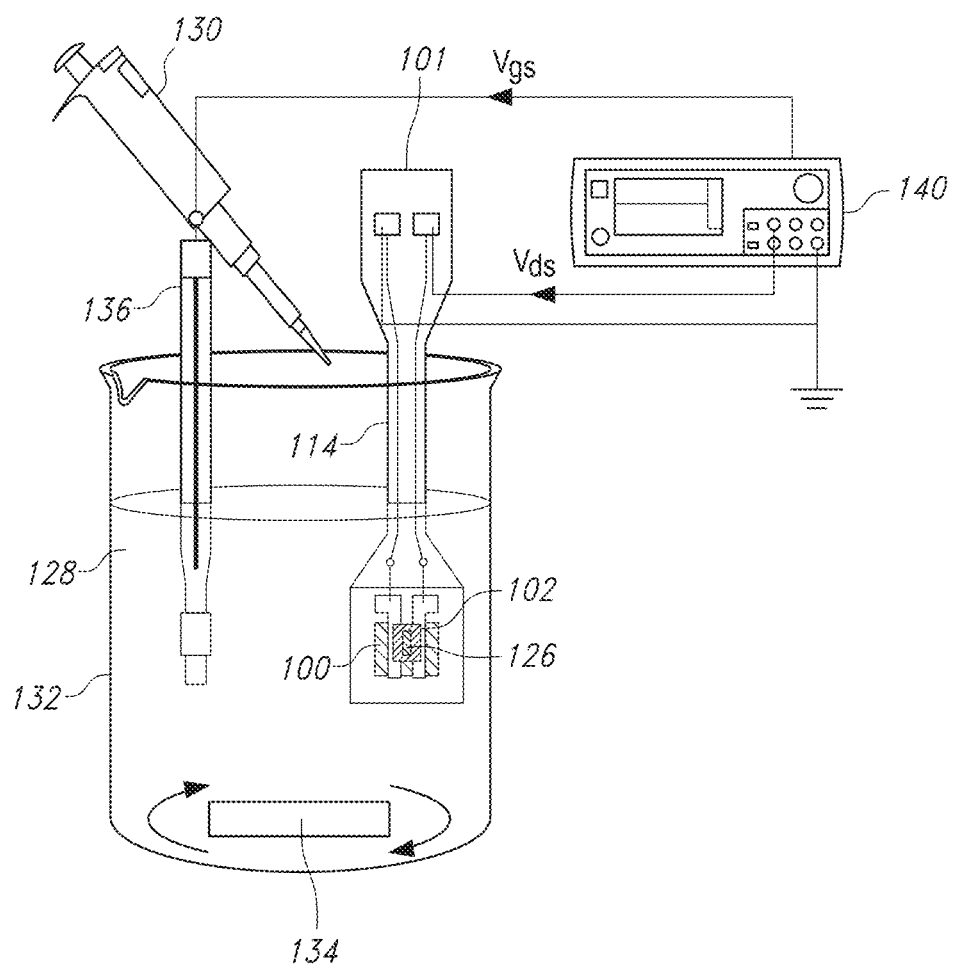
FIG. 4 is a schematic illustrating the use of the GISFET of the present invention to determine the ion concentration in a test solution.

Further, for stable operation in an electrolytic environment, the GISFET 100 formed according to the method described above can then be mounted onto a printed circuit board (PCB) 114 to form a GISFET device 101 and the source and drain contacts 106 and 108, respectively, can be wire bonded via wires 116 and 118, respectively, to corresponding contact pads 120 and 122 on the PCB 114. To isolate and protect the source and drain contacts 106 and 108 and the bonding wires 116 and 118 from the conducting aqueous environment in which the device 101 will be used, an encapsulation layer 124 can be disposed around such components. As shown in FIGS. 1 and 2, the encapsulation layer 124 can be applied to the metal contacts 106/108, the substrate 104, the graphene film 102, and the source and drain wires 116 and 118, leaving a small window (on the ion selective membrane (ISM) 112 coated graphene film 102 exposed, where the window serves as the active sensing area 126 that comes in contact with the test solution 128 during use of the GISFET device 101, as shown in FIG. 4 and discussed in more detail in the Example section below.

Example 1

In Example 1, GISFETs as contemplated by the present invention were synthesized, characterized, and used to measure the concentration of $K^+$ in distilled water.

Graphene Growth

Graphene samples used to fabricate the GISFETs were synthesized using chemical vapor deposition (CVD) in a semi-automated quartz tube furnace system. Briefly, monolayer, uniform graphene over a large area was grown on a copper foil (Alfa Aesar, 99.999% purity), which acted both as the substrate and catalyst. Methane was used as the growth precursor, along with $H_2$ and Ar as the carrier gases, which were delivered to the furnace using mass flow controllers (MFCs, MKS Instruments) at nominal flow rates of 100, 100 and 900 standard cubic centimeters per minute (sccm), respectively. The copper substrate was annealed at 1000° C. for 2 hours under a continuous flow of $H_2$ and Ar gases prior to growth, which was followed by the graphene growth at 1035° C. over a duration of 20 minutes under a continuous flow of methane.

GISFET Chip Fabrication

Graphene films synthesized on Cu foils were used to fabricate GISFET devices following a sequence of processing steps as discussed below. To begin with, a Cu foil with graphene film was coated with polymethyl methacrylate (PMMA) using a spin coater and was then baked for 1 minute at 150° C. Next, the graphene layer on the back side of the sample was removed by oxygen plasma etching (Plasma Etch, PE25-JW-HF), which was followed by Cu etching in ammonium persulfate solution for over 3 hours, releasing the graphene/PMMA top layer. After rinsing in deionized water, the graphene/PMMA layer was transferred and placed on a $SiO_2$ (300 nm thickness)/Si ($n^+$ doped) substrate in isopropyl alcohol and allowed to dry for 15 minutes. Finally, the sample was dipped in acetone for 4 hours to remove the PMMA. To fabricate the GISFET, titanium (Ti) (30 nm thickness)/nickel (Ni) (150 nm thickness) source and drain contacts were deposited on the transferred graphene using an electron beam evaporator, with the contact areas defined by a metal mask. The graphene channel formed had dimensions of 2 mm×1 mm. High-quality $SiO_2$ grown through a dry thermal oxidation process was used to minimize any leakage current between the metal contacts and the silicon substrate. To determine their material qualities, the graphene films were characterized using Raman spectroscopy (Renishaw Raman system, InVia) and atomic force microscopy (D3100 from Veeco).

Valinomycin Based Ion Selective Membrane (ISM) Preparation

To perform selective detection of $K^+$ ions, a valinomycin ($C_{54}H_{90}N_6O_{18}$) based ion selective membrane (ISM) with 5 μm nominal thickness was spin-coated on the entire transferred graphene area and kept at room temperature for 20 minutes for complete solvent volatilization and stable film formation. The $K^+$ ion selective membrane was prepared by dissolving 8 milligrams (mg) valinomycin, 1.10 mg potassium tetrakis (4-chlorophenyl) borate (K-TCPB), and 390 mg block copolymer (made of methyl methacrylate (MMA) and n-butylacrylate (nBA) monomers in the proportion of 1:10) in 2.0 milliliters of tetrahydrofuran. To ensure optimum device performance and reliability, a self-plasticized methacrylate and nBA based copolymer was developed. This block copolymer is a two-phase system; mostly containing an nBA block, which forms a continuous amorphous phase through which molecular transportation occurs rapidly, while the methacrylate block forms a discontinuous, crystalline phase that cross-links the structure. In addition, the higher molecular weight of 151,000 Da of the methacrylate and nBA copolymer provides sufficient polymer chain entanglement to make the membrane more mechanically robust and stable in harsh operating conditions, while maintaining a very low predominant glass transition temperature (−43.05° C.) that enables easy ion transportation across the membrane towards the graphene surface.

Furthermore, potassium tetrakis(4-chlorophenyl) borate (K-TCPB) having mobile cation-exchange sites has been dispersed in the polymer membrane, which reduces the membrane resistance and activation barrier for the cation-exchange reaction at the membrane/solution interface, resulting in a significant reduction in ionic interfaces, thereby increasing the ion-detection sensitivity. Taken together, the components of the resulting polymer membrane formulation uniquely offer all the necessary attributes for a highly sensitive, selective, reliable non-plasticized polymer membrane for biomedical and solid-state microfabrication ion sensors.

The valinomycin structure includes alternately bound amide and ester bridges. The presence of the carbonyl group, coupled with its unique doughnut-shaped structure enables valinomycin to easily bind metal ions. Due to the size of the potassium ion (1.33 Å radius), valinomycin exhibits a very high stability constant (K=106) toward the potassium ion compared to other metal ions. This results in a high degree of selectivity compare to other complexes; i.e. $Na^+$ ion with a 0.95 Å radius forms a 10,000 fold weaker valinomycin-$Na^+$ complex, and thus valinomycin is 10,000 more times selective to K+ ions. While the $K^+$ ion by itself is able to cross a single lipid bilayer, it has been shown that the presence of valinomycin in the lipid layers makes the $K^+$ ions freely permeable through multiple lipid bilayers. This property was utilized in the present design of the ion selective layer to make it specifically permeable to $K^+$ ions. Another important advantage of using valinomycin when designing a sensor to detect potassium is that it can act as a functionalization layer on the graphene surface of the GISFET, thus enhancing its sensitivity.

Encapsulation

Figure 3:
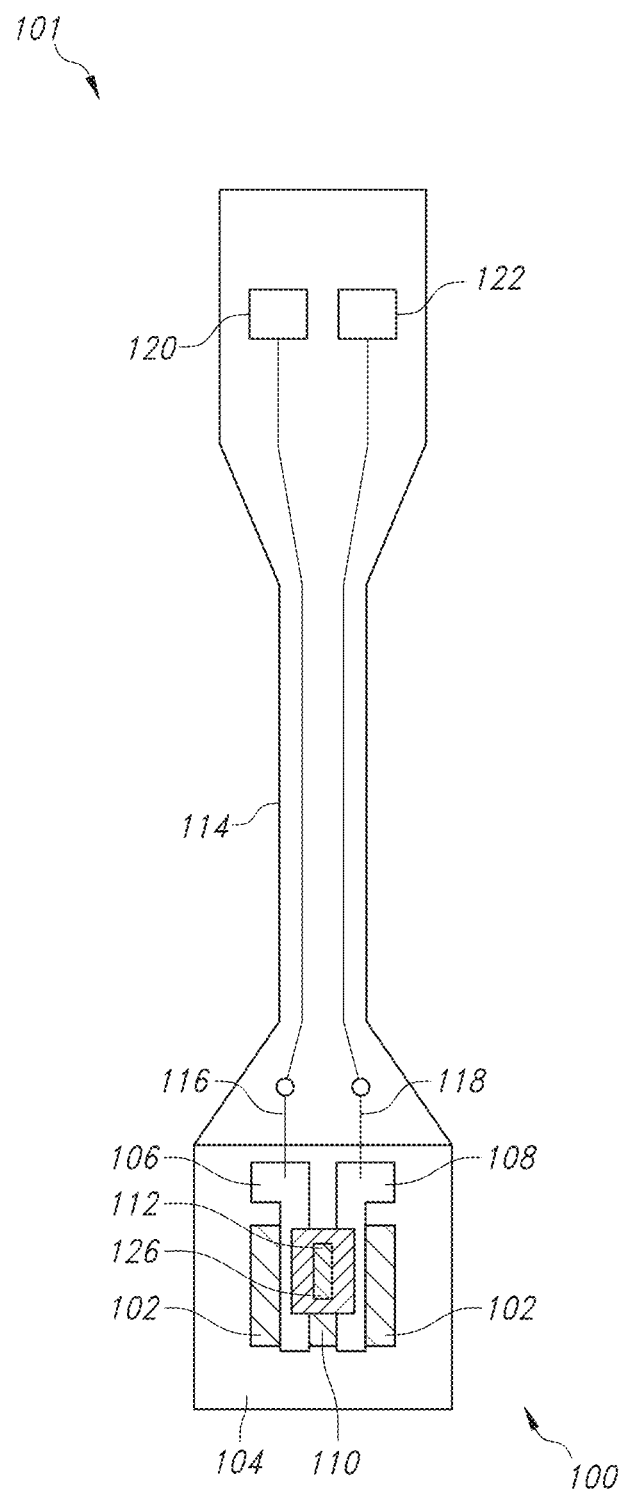
FIG. 3 illustrates a top view of the GISFET of FIGS. 1 and 2 after the ion sensitive field effect transistor has been mounted onto a printed circuit board.

Referring to FIG. 3, for stable operation in an electrolytic environment, the GISFET chip 100 was mounted on a printed circuit board (PCB) 114 to form a system 100 and the source and drain ohmic contacts 106 and 108, respectively, were wire bonded via wires 116 and 118, respectively, to corresponding contact pads 120 and 122 on the PCB 114. To isolate and protect the metal contacts and the bonding wires from the conducting aqueous environment, epoxy glue (Epo-tech 301) was used to form an encapsulation layer 124 around them. The selected epoxy is biocompatible and specially designed for medical electronics with USP Class VI and/or ISO-10993 compliance. After careful mixing of epoxy resin and curing agent (4:1), the mixture was applied to the metal contacts 106/108, $SiO_2$/Si chip/substrate 104, and bonding wires 116 and 118, leaving a small window (2 mm×1 mm in dimension) on the ion selective membrane (ISM) 112 coated graphene film 102 as the active sensing area 126 (to be in contact with the test solution 128), and cured for 2 hours at 60° C. on a hot plate.

ISFET Electrical Properties and Performance Recording Methods

The electrical characteristics of the fabricated graphene FET and GISFET were studied thoroughly and systematically in the air and in an electrolytic solution, respectively. Carrier mobility was measured using a back-gated FET configuration, while Hall mobility measurements were carried out using an HMS 3000 (Ecopia) system. The experimental setup for measurements in the electrolytic solution 128 is schematically illustrated in FIG. 4, where details of the device 101 are also shown in FIGS. 1-3. The Ag/AgCl reference electrode 136 was used to apply a top-gate bias for obtaining the $I_{ds}$-$V_{tg}$ characteristics of the GISFET 100 in a test solution 128 contained within a beaker 132. For the I-V measurement, dc bias for $V_{ds}$ and $V_{gs}$ was supplied by a precision source measure unit 140 (SMU, Keysight B2902A), while simultaneously measuring $I_{ds}$. The device 101 response was studied by varying the $K^+$ ion concentration from 1 M to 20 mM in distilled water, in Tris-HCl solution, as well as in 140 mM NaCl solution (imitating the $Na^+$ ion concentration in a typical physiological solution). Test electrolytes with desired ionic concentrations were realized using carefully prepared stock solutions transferred using micropipettes 130, where the test solution 128 was uniformly mixed in the beaker 132 via a stir bar 134. The measured $I_{ds}$-$V_{tg}$ curves show typical V-shaped I-V characteristic underlining sharp transition from p- to n-type graphene upon application of top-gate bias.

Structural Characterization

Figure 5A:
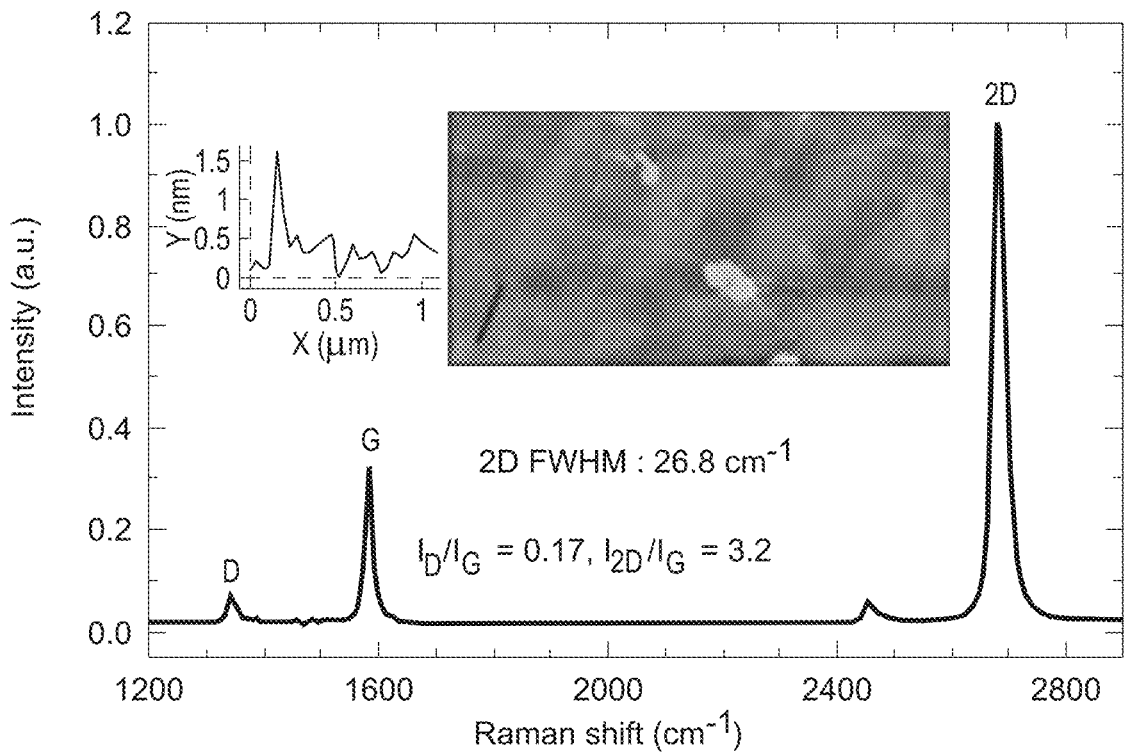
FIG. 5*a* is a graph illustrating the Raman spectroscopy of a graphene layer transferred onto a silicon dioxide substrate, showing good quality of graphene coverage, where the right inset photograph is an atomic force microscopy (AFM) image of the graphene layer, exhibiting smooth graphene layer surface and folds and the left inset graph is a line profile of the graphene layer AFM image.

FIG. 5(a) shows a typical Raman spectrum for our samples with signature D, G and 2D peaks. The ID/IG ratio of about 0.17 indicates good quality of the graphene layers. The 2D peak full width at half maximum (FWHM) value of about 26.8 $cm^{-1}$, and the intensity ratio of the 2D band (at 2682 $cm^{-1}$) and G band (at 1585 $cm^{-1}$) was 3.2, indicating the presence of a single layer of monolayer graphene. The inset of FIG. 5(a) shows an atomic force microscopy (AFM) morphology image (2.5 m×5 m) taken from a transferred graphene film 102 after undergoing an annealing process, which was carried out in a quartz tube at 400° C. for 2 hours in the forming gas environment to remove any residue of PMMA. The right inset AFM image showed smooth and continuous graphene film 102, exhibiting folds that are commonly observed after transfer.

Electrical Characterization

Figure 5B:
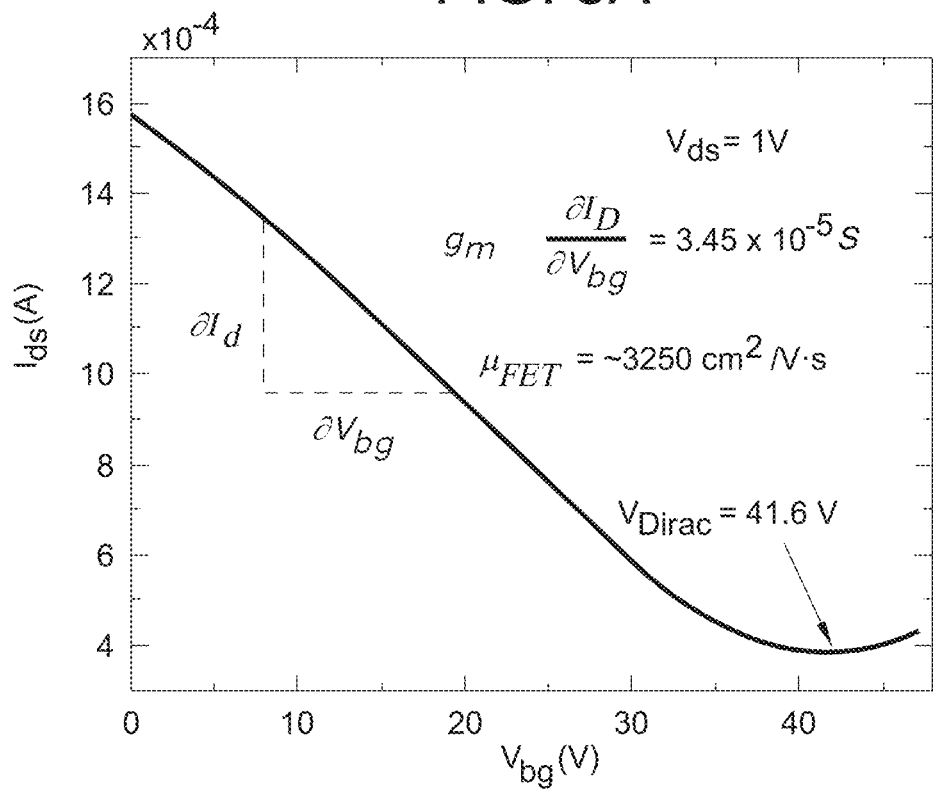
FIG. 5*b* is a graph illustrating a graphene field effect transistor's mobility extraction, where the $I_d$-$V_{bg}$ characteristic is measured from the graphene field effect transistor device and the plot shows graphene's typical V-shaped characteristics.
Figure 5C:
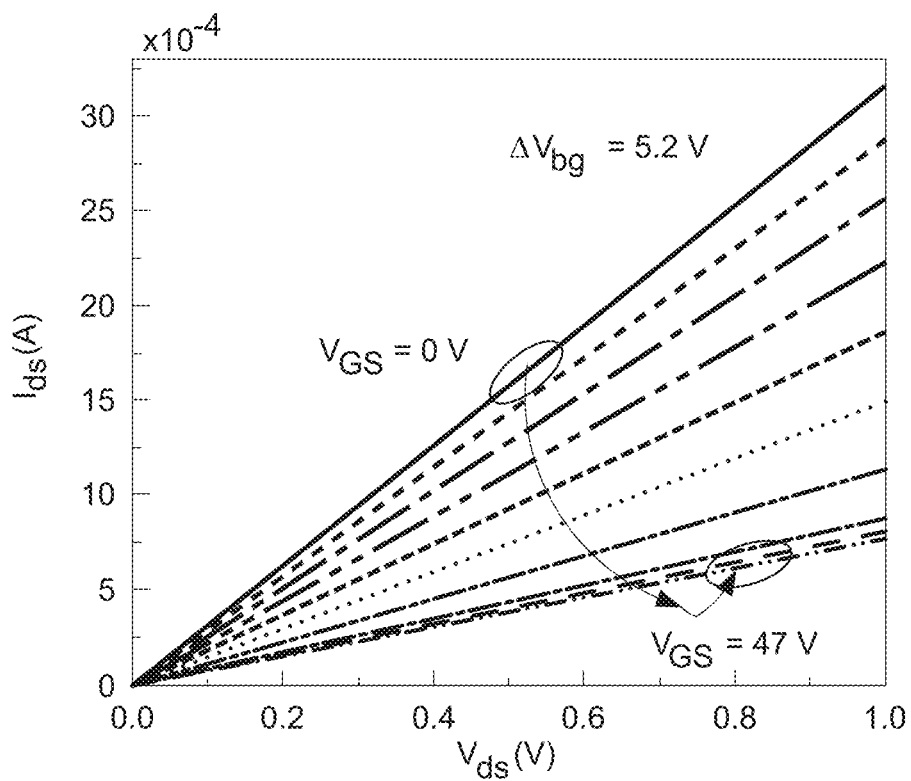
FIG. 5*c* is a graph illustrating a family of $I_d$-$V_{bg}$ plots when the back gate voltage ($V_{bg}$) is varied.

Charge carrier mobility is an important parameter directly affecting the sensitivity of the graphene ISFET device. Therefore, the back-gated FET mobility was measured, as well as Hall mobility before moving on to GISFET device 101 fabrication. Referring to FIGS. 1-3, for measuring FET mobility, Ti/Ni metal stacks were deposited on the transferred graphene film 102 to form source contact 106 and drain contact 108, with a graphene channel 110 of dimensions of 2.8 mm×1.5 mm between them. The highly doped silicon layer 104b was used as the back gate of the substrate 104 with 300 nm $SiO_2$ as the insulator layer 104a disposed between the silicon layer 104b and the graphene film 102. The $I_{ds}$-$V_{bg}$ plot (see FIG. 5(b)) is ambipolar in nature which is a direct consequence of linear dispersion relation in graphene with zero band gap. The Dirac point was observed at $V_{bg}$=41.6 V. A positive Dirac point indicates that CVD grown graphene transferred on $SiO_2$ is p-type in nature, which is expected and commonly observed. The FIG. 5(c) plot shows a linear $I_{ds}$-$V_{ds}$ family of curves where the back-gate bias varies from 0 to 47 V at a $V_{bg}$ increment of 5.22 V. A good back gate modulation was observed (supporting expected p-type graphene behavior), and the FET hole mobility was calculated using the formula $\mu_{FET}$=($g_m$L)/(WCox$V_{ds}$). Here $g_m$ is the transconductance ($\partial I_{DS}/\partial VGS$) at the p-type graphene side, L and W are the length and width of the graphene channel 110, respectively, and Cox is the oxide capacitance per unit area. Using an extracted $g_m$ value of 3.45×$10^{-5}$ S from the $I_{ds}$-$V_{ds}$ characteristic, the mobility was found to be 3250 $cm^2$/Vs, which is comparable to the mobility of typical high quality graphene transferred on $SiO_2$.

Hall mobility measurement was also carried out on the same graphene sample and compared to the FET mobility. To measure Hall mobility, a 6×6 mm square shape graphene film was transferred on the $SiO_2$ substrate, and simple indium (In) press contacts were established on each of the four corners of the sample. The Hall mobility of the graphene sample was measured to be 2660 $cm^2$/Vs, which is comparable to the FET mobility extracted above, with the reduction attributable to the bigger size of the graphene layer used for Hall measurements (6 mm×6 mm) compared to FET (1.5 mm×2.8 mm), which exhibits an average mobility over a larger area that is typically smaller.

GISFETs Measurements of $K^+$ Ionic Concentration in Distilled Water

Figure 6A:
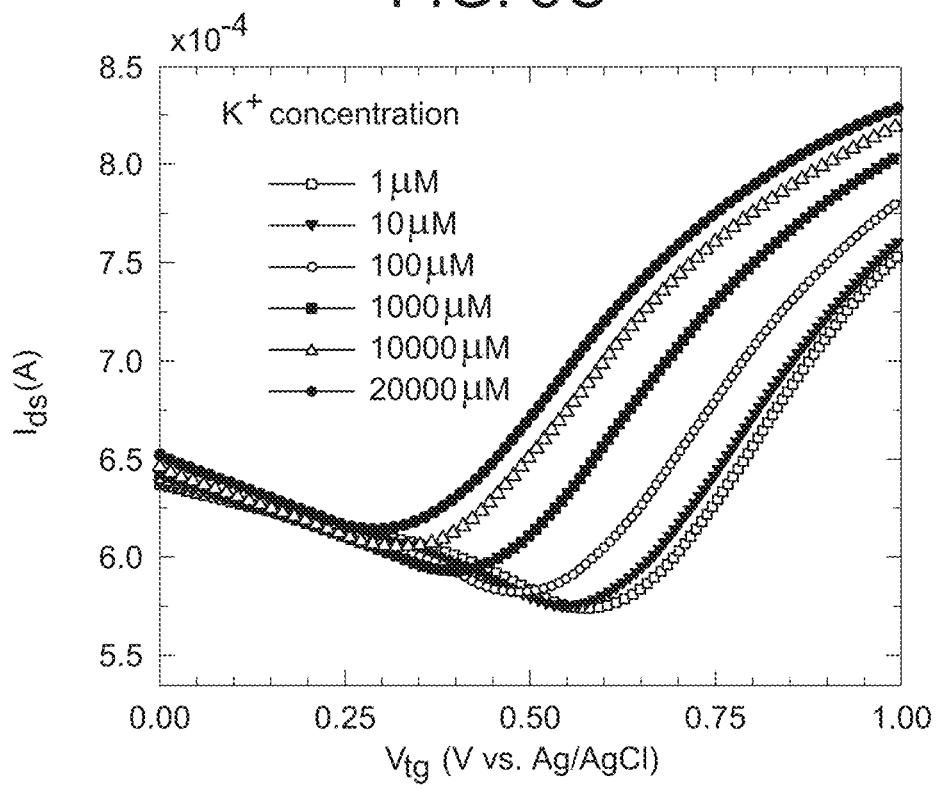
FIG. 6*a* is a graph illustrating the $K^+$ sensing of the graphene ion selective field effect transistor of the present invention in a distilled water-based electrolyte solution, where Dirac points can be seen to shift significantly as the $K^+$ concentration increases from 1 micromolar ($\mu M$) to 20 millimolar (mM).

After fabrication of the GISFET, detailed electrical characterization was performed and investigated the $K^+$ sensitivity of the GISFET in distilled water based $K^+$ ion solution was investigated. The variation in drain current with top gate voltage ($I_{ds}$-$V_{tg}$ characteristics) was measured using a standard Ag/AgCl reference electrode (where the gate voltage was applied), in a test electrolyte solution of variable KCl concentration, and the results are plotted in FIG. 6(a). The Dirac point in the $I_{ds}$-$V_{tg}$ plots can be seen to vary from 0.2-0.7 V, which is a dramatic reduction compared to the Dirac point of about 40.6 V measured for the same FET in air prior to valinomycin coating (please refer to FIG. 5(b)). This large change in Dirac point can be attributed primarily to the strong electron donating nature of the valinomycin molecule which possesses 6 amides (RnE(O)×NR'$_2$) functional groups. Indeed, separate experiments conducted on back gated FETs in ambient conditions indicate that a large Dirac point shift, by 20-30 V, can be caused by valinomycin coating, which donates electrons to p-type graphene to shift the Dirac point closer to 0 V. Another important point to note here is that the high capacitance of the electrical double layer (EDL), formed at the interface of graphene and the electrolytic solution, enables the ISFET device to operate at a much narrower voltage range (i.e., charge density and Fermi level changes much more rapidly with applied top gate voltage; $g_m$ change from about $10^{-5}$ S for back-gate FET to about $10^{-4}$ S for top-gate FET), which offers a significant advantage for practical sensor design. Indeed, the capacitance for a back-gated FET can change by orders of magnitude from the nF/cm² range in air (closely matching our extracted capacitance of 11.5 nF/cm²) to the F/cm² range in the electrolytic environment. From FIG. 6(a), it is also observed that the Dirac point shifts very significantly, from 0.57 V to 0.29 V, as the K⁺ concentration increases from 1 M to 20 mM. Such a movement of the Dirac point to lower values is expected since the K⁺ ions near or at the graphene surface induces higher electron concentration (i.e., reduces hole concentration in p-type graphene), thereby moving the Fermi level closer to the charge neutrality point, and consequently lowering the Dirac point. Such a lowering of the Dirac point due to adsorption of positively charged ions is also observed commonly for H⁺ ions in a pH ISFET.

Sensitivity and Response Time

Figure 6B:
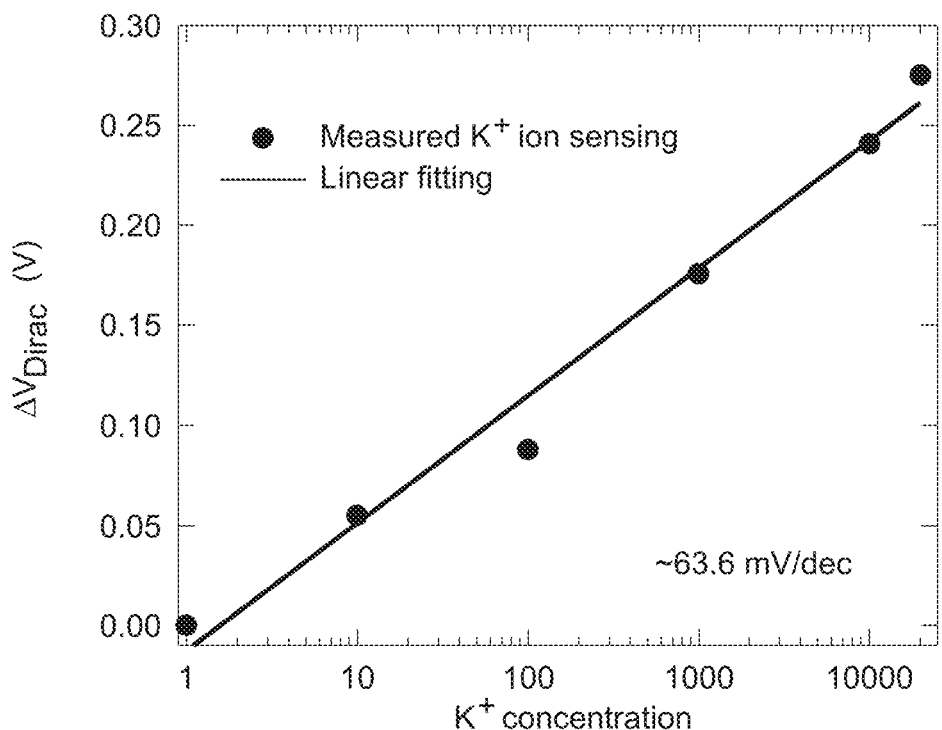
FIG. 6*b* is a graph illustrating how the Dirac point shift varies with $K^+$ concentration change fairly linearly, showing an average sensitivity of about 64 millivolts/decade (64 mV/dec) for the least square fit.

Since sensitivity and response time are two critical parameters for any sensor, these parameters were carefully examined for the GISFET of the present invention. A commonly used method to determine the sensitivity of ISFETs (i.e., commercial Si ISFETs) is to look at the shift in threshold voltage (equivalent to the shift in Dirac point of the GISFET) as a function of the change in K⁺ ion concentration. The change in Dirac point as the K+ ion concentration was varied from 1 μM to 20 mM (this includes the range of interest for cellular efflux of 10 μM-1 mM) can be determined from FIG. 6(b) to be about 280 mV, and hence the sensitivity can be calculated as 64 mV/decade (FIG. 6(b)), which is very comparable to that obtained from the Si-based ISFET devices.

Figure 6C:
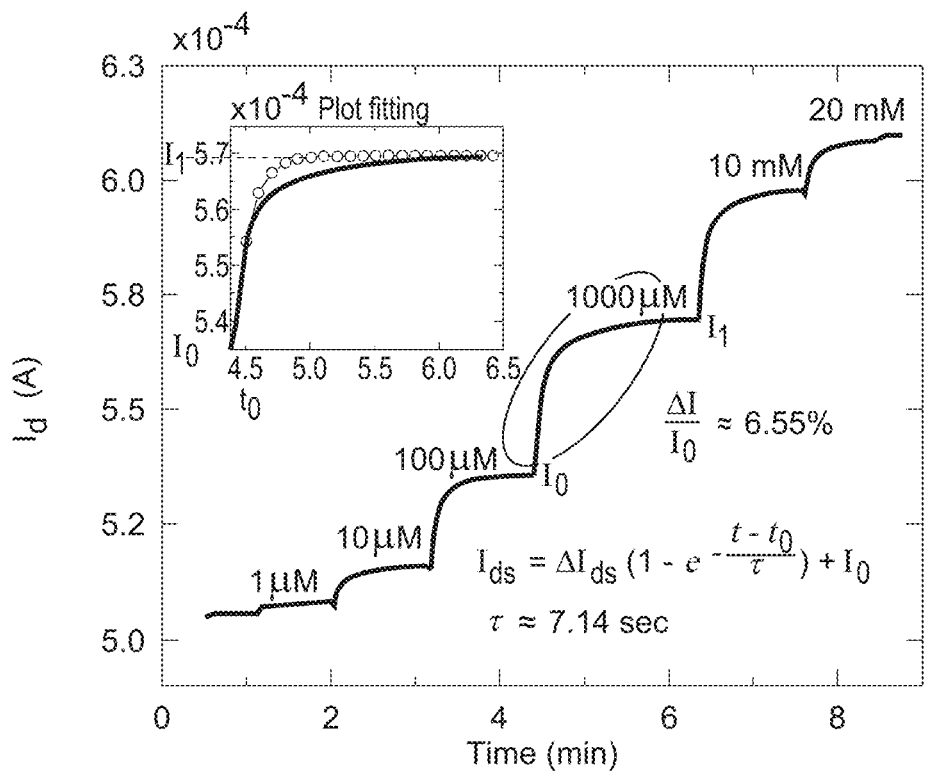
FIG. 6*c* is a graph illustrating the current change response as the $K^+$ concentration was changed in steps from distilled water to 20 mM, where the fractional change in current used to calculate sensitivity and time constant for sensing response are calculated from exponential fits to the response transients corresponding to each concentration change.

Another method (commonly used for chemical sensors) to determine the sensitivity and the response time is to determine the magnitude and temporal variation of the ISFET drain current as the K⁺ ion concentration is changed in steps. To this end, were corded the $I_{ds}$ as a function of time for various K⁺ concentrations (for a fixed value of $V_{tg}$) using a data acquisition unit (DAQ, Keysight34972A); and the results are shown in FIG. 6(c). A plot of the concentration change from 100 μM to 1 mM (corresponding to typical cellular efflux) is shown in the inset of FIG. 6(c) to calculate the response time and current change based sensitivity (ΔI/I, similar to the sensitivity calculated for chemical sensors). As can be seen, the current changes from 528 to 563 amps (A), corresponding to a fractional change in current of about 6.6% per decade change in K⁺ ion concentration. Fitting the time-dependent response plot with an exponential function, a time constant τ of about 7.1 seconds (s) can be extracted, which is very close to the best values of about 5 s observed for commercial pH sensors (Topac, S1600 Advanced pH meter).

Figure 7A:
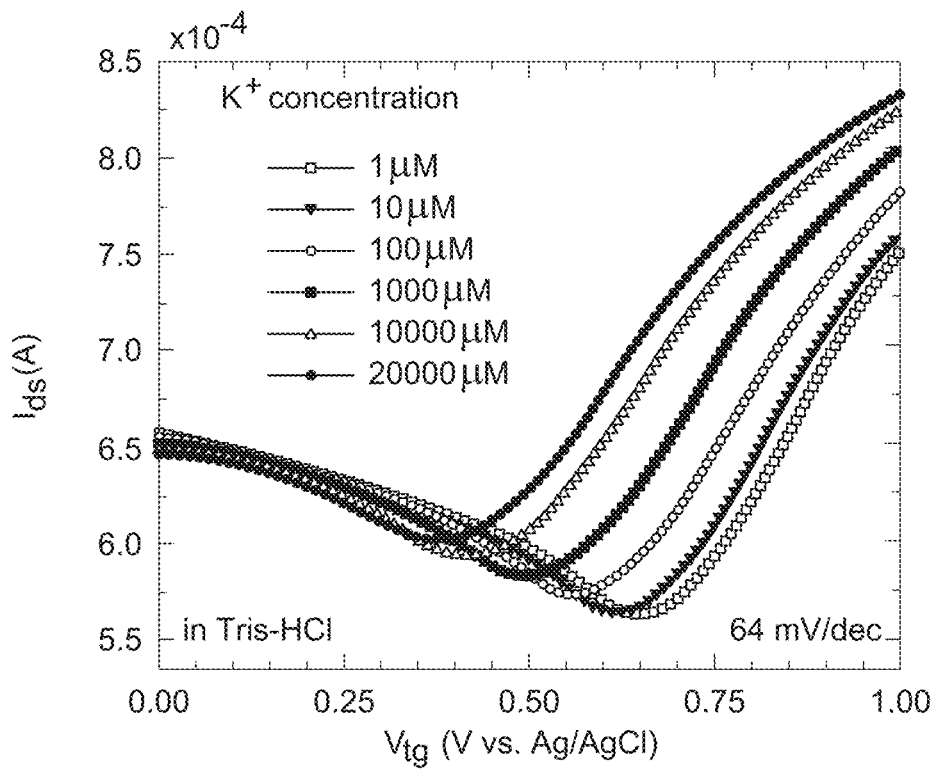
FIG. 7*a* is a graph illustrating the stable sensitivity of the GISFET of the present invention for sensing $K^+$ in a 0.1 M Tris-HCl solution (pH 7.4), where the sensitivity to $K^+$ is similar to the values achieved for the distilled water based solution.

Measurements of K⁺ Ionic Concentration in Tris-HCl Solution and High Na⁺ Concentration To determine the applicability of the GISFETs for K⁺ ion measurements in physiological solution, its performance was investigated in a 0.1 M tris-HCl solution with pH 7.4 (from VWR), which is commonly used in buffer solutions for biochemistry and molecular biology experiments (i.e., Protein Electrophoresis, Western Blotting and Nucleic Acid Agarose Electrophoresis). The results for K⁺ ion sensing are illustrated in FIG. 7(a) where the Dirac point is found to shift by 275 mV for a 4.3-decade change in K⁺ concentration, exhibiting a sensitivity of 64 mV/decade, which is exactly same as that obtained for K⁺ concentration variation in distilled water discussed above.

To further test the suitability of the sensor of the present invention for usage in physiological solutions, where typically a very high (e.g., about 150 mM) background concentration of Na⁺ is present, the performance of the device in concentrated NaCl solution (140 mM) was tested. The sensitivity is found to be 65 mV/decade in the sensing range of 10 μM-20 mM, showing very similar sensitivity to the distilled water based solution. Below 10 μM, reliable sensing of the K⁺ ion variation was found to be difficult as the high Na⁺ concentration increased the K⁺ ion sensing baseline (this is actually expected based on the expected selectivity of 10,000 for K⁺ ions relative to Na⁺ ions as discussed above). Nonetheless, the operational range of the sensor completely covers the concentration range of interest for cellular efflux measurements of 10 μM-1 mM (see discussion above).

Ion Selectivity of GISFETs

Figure 7B:
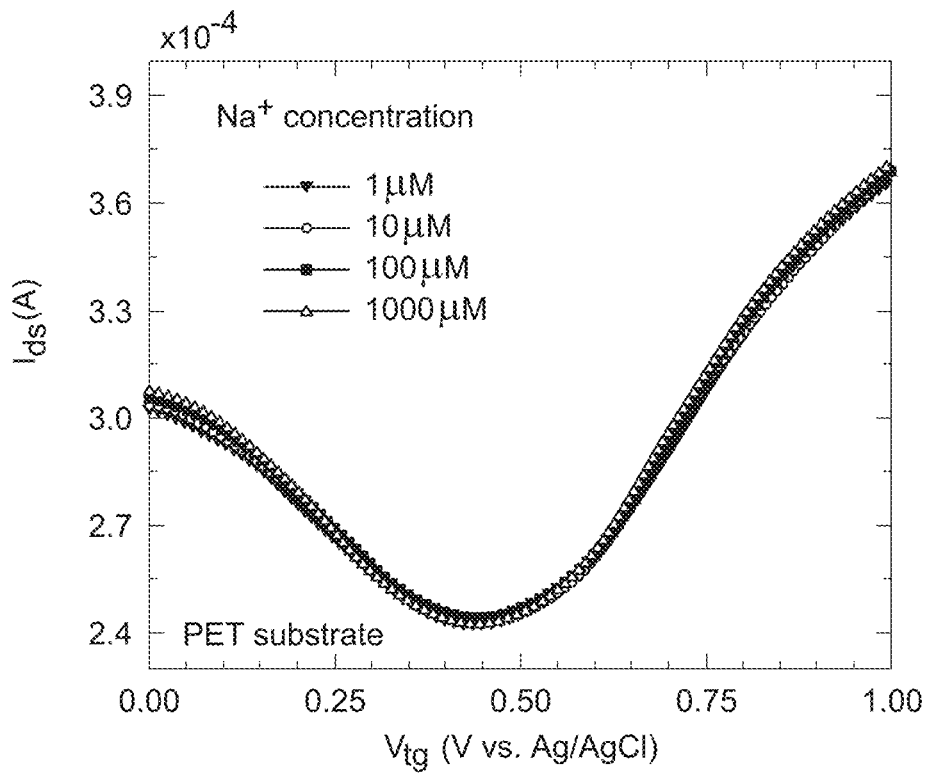
FIG. 7*b* is a graph illustrating that the GISFET with a valinomycin polymer matrix coating is effectively insensitive to $Na^+$ ions over the concentration range of 1 $\mu M$ NaCl to 1000 $\mu M$ NaCl when the measurement was performed in a distilled water-based solution, as can be inferred from the overlapping I-V plots.
Figure 7C:
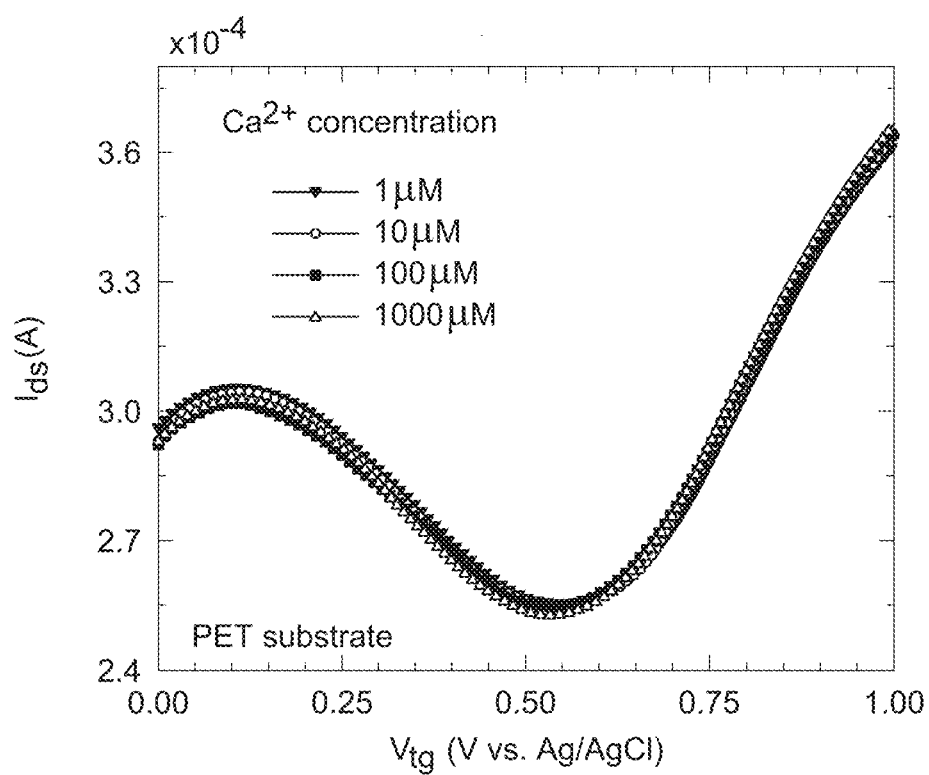
FIG. 7*c* is a graph illustrating that the GISFET with a valinomycin polymer matrix coating is effectively insensitive to $Ca^{2+}$ ions over the concentration range of 1 $\mu M$ $CaCl_2$) to 1000 $\mu M$ $CaCl_2$) when the measurement was performed in a distilled water-based solution, as can be inferred form the overlapping I-V plots.

Although graphene-based ISFETs have been extensively studied for pH sensing or Na⁺ sensing by many research groups, the ion-selectivity aspect in generally not investigated in detail, although it is one of the most important characteristics of any sensor. In this research, the ISFETs were made so that it was selective to K⁺ ions by coating them with valinomycin based ISM. Details of the mechanism and preparation for the ISM coating have been discussed herein. In a device structure, when the device is interfacing with an electrolyte solution, valinomycin in ISM selectively traps only K⁺ ions from the solution, forming a valinomycin-K⁺ complex, which can further transit to the vicinity of graphene surface. The electrical field exerted from the captured K⁺ ions affects the conductivity of graphene channel and thus induces an electrical sensing signal. The ion selectivity of the sensor was studied by comparing the responses of the GISFETs to common background ions $Ca^{2+}$ and Na⁺ vis-a-vis the K⁺ ions. FIGS. 7b and 7c present the responses to Na⁺ and $Ca^{2+}$ ions over the range of 1 μM-1 mM. It was found that even though the concentration of these ions changed by 3 orders of magnitude, the Dirac point did not shift, clearly highlighting the high selectivity of the GISFETs of the present invention with respect to these interfering ions. In contrast, a large response was observed for K⁺ ions in distilled water based solution and also in presence of high interfering ionic concentration (i.e., 140 mM Na⁺) as already discussed in detail above. This clearly underlines the high selectivity of one embodiment of the GISFET sensor of the present invention for K⁺ using a valinomycin-based ion selective membrane, although it is to be understood that other stable ion selective membranes can be formed for other ions of interest as discussed in detail above.

Repeatability and Reliability of GISFET Device

Figure 8A:
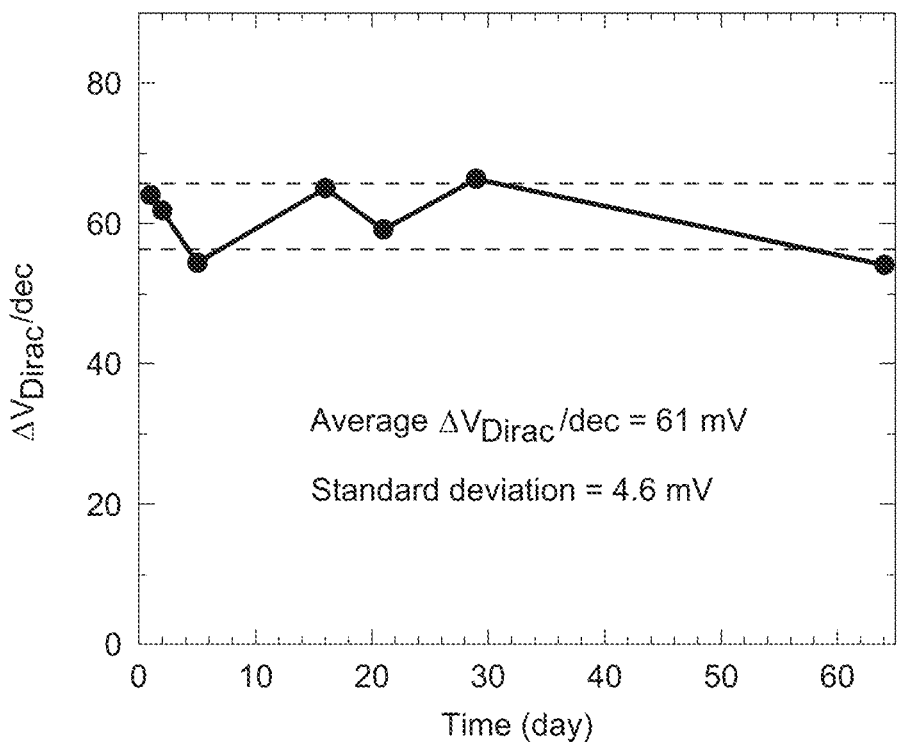
FIG. 8*a* is a graph illustrating the sensitivity of the GISFET of the present invention measured over a duration of two months, showing a stable response with an average sensitivity of 61 mV/dec and a standard deviation of 4.6 mV/dec.

For robust ion sensing applications, the ionic concentration measurements by the ISFET need to be reliable and repeatable. To study this, the performance of a GISFET was recorded over a period of two months by periodically measuring its sensitivity to K⁺ ion concentration. The results are shown in FIG. 8(a), which shows an average sensitivity of 61 mV/dec over a course of two months with a standard deviation of 4.6 mV/dec. It should be noted that the sensitivity of the device exhibits a range bound fluctuation over the course of the month instead of exhibiting any monotonically varying trend, which rules out steady degradation of the ISFET device over time, unlike widely observed for its Si counterparts. The cause for such small fluctuations are still under investigation but likely contributed by randomly varying experimental and environ-mental factors. For a given measurement the ionic concentration was measured at least 3 times by the GISFET sensor, which was found to be highly repeatable, with only 1% deviation from the mean sensitivity value.

GISFET Device on Polymer Substrate

Figure 8B:
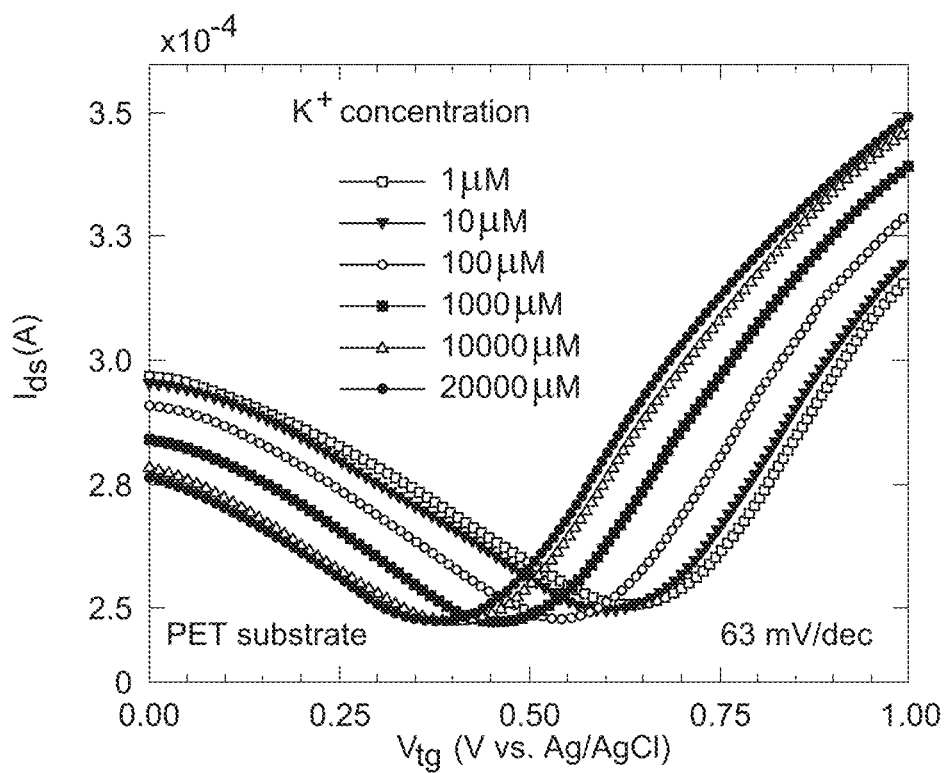
FIG. 8*b* is a graph illustrating the ion sensitivity of the GISFET of the present invention on a flexible polyethylene terephthalate (PET) substrate, where the GISFET exhibited an average $K^+$ ion sensitivity of about 63 mV/dec over a concentration range of 1 $\mu M$ to 20 mM.
Figure 8C:
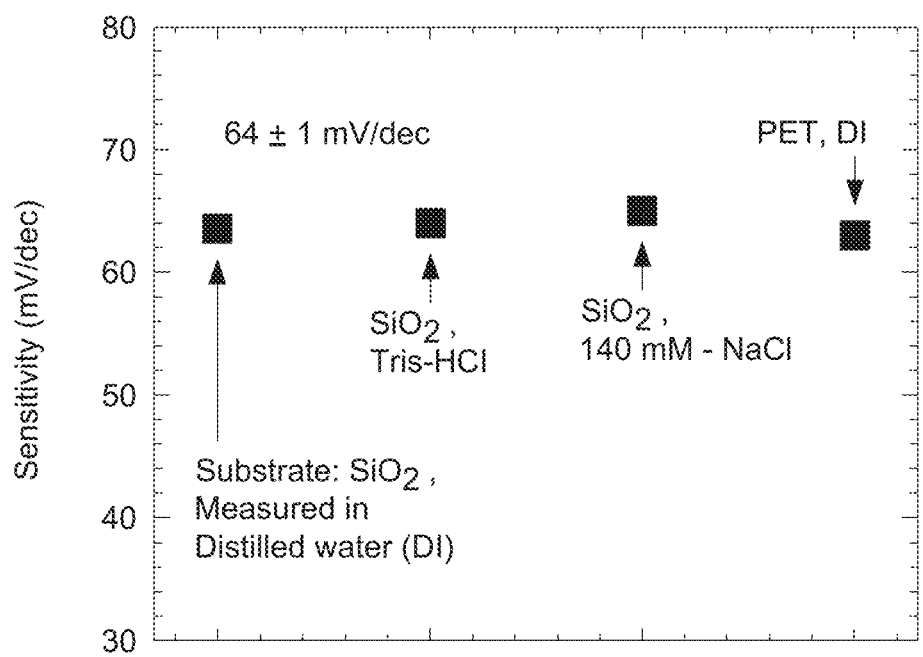
FIG. 8*c* is a graph comparing the ion sensitivity of the GISFET of the present invention on various substrates (e.g., silicon dioxide and PET) when the ion sensitivity was measured in distilled water, Tris-HCl, or NaCl.

Fabrication of ISFETs on flexible substrates is highly attractive for implantable biosensing applications. Unlike Si-based ISFETs, graphene is inherently compatible with flexible substrates due to its own flexible nature and easy transfer process of chemical vapor deposition (CVD) of graphene to various substrates without undergoing any cumbersome fabrication process. Polyethylene terephthalate (PET) is a material widely used for numerous applications involving our daily life (i.e., in bottles, packaging materials etc.) due to its extremely low toxicity and low cost. It is also a material of choice for technical applications (i.e., automotive and electronics) owing to its excellent dielectric strength and chemical inertness. In this example, the feasibility of fabricating high-performance graphene-based ISFETs on a PET substrate was investigated. The fabrication steps and materials used are very similar to the GISFETs on $SiO_2$/Si substrate, except the substrate itself is replaced with PET. The performance of GISFETs on PET was determined in the same way as discussed above, and the results are shown in FIG. 8(b). It was found that the $K^+$ ion sensitivity was about 63 mV/dec (272 mV/4.3 decades), which is essentially unchanged compared to that measured for Si/$SiO_2$ substrate (about 64 mV/dec). The selectivity of the graphene ISFET on PET, with respect to $Na^+$ and $Ca_2^+$ ions, also turns out to be very similar to that observed for the ISFET on $SiO_2$/Si substrate. Both the selectivity and sensitivity results clearly indicate the strong promise of PET substrate for realizing high-performance graphene ISFETs for implantable biosensing applications. The stable performance of GISFETs in different solutions and/or fabricated on different substrates are shown in FIG. 8(c).

CONCLUSIONS

In conclusion, a novel ISFET device capable of performing highly sensitive and selective detection of $K^+$ ions in various media over a wide ionic concentration range of 1 µM-20 mM. The sensitivity exhibited by the sensor of 61±4.6 mV/decade over a duration of two months is very comparable to the best Si-based ISFETs available commercially, while the sensor response to interfering $Na^+$ and $Ca_2^+$ ions were found to be negligible. The $K^+$ ion detection performance of the sensor remained unaltered in presence of orders of magnitude higher $Na^+$ concentrations, and also in Tris-HCl solution, indicating the effectiveness of the sensor for sensing in physiological solutions. The sensor performance also did not change significantly with repeated testing over a period of two months highlighting its robustness and reliability. When fabricated on a PET substrate, the sensor shows very similar performance, which is highly encouraging for developing flexible bio-implantable graphene-based ISFETs.

Example 2

Figure 9:
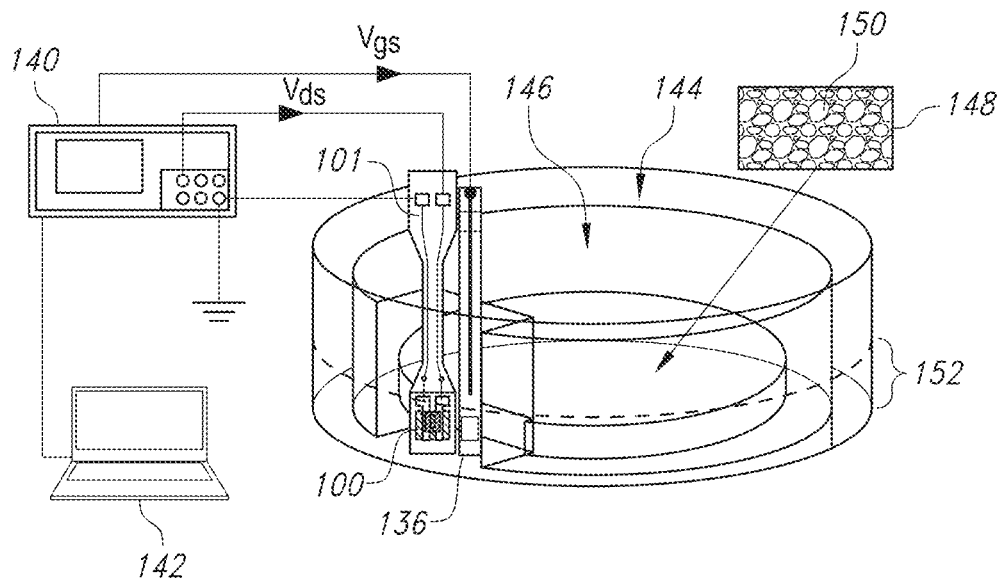
FIG. 9 is a schematic illustrating the use of the GISFET of the present invention to determine the ion efflux from cells.

In Example 2, GISFETs as contemplated by the present invention were fabricated as described in Example 1 and were then used to measure the $K^+$ efflux of human colonic epithelial cells. FIG. 9 is a schematic illustrating the use of the graphene ion sensitive field effect transistor (GISFET) of the present invention to determine the $K^+$ efflux from cells.

Specifically, human colonic T84 epithelial cells were used to investigate performance of the GISFET of the present invention. The $Ca^{2+}$-activated non-selective cation (NSC) channels on the T84 cells were activated with $Ca^{2+}$ ionophore A23187 (1 mM), and then the corresponding $K^+$ efflux was detected and quantified by measuring the extracellular K+ ion concentration.

First, and referring to FIG. 9, cells 150 were plated on 25 millimeter diameter graphene-coated glass coverslips 148 and placed underneath of a specially designed mold 146 in a well plate 144. Then, a 1.5 mL of physiological solution 152 (normal saline solution consisting of 140 mM NaCl, 5 mM KCl, 1 mM CaCl2, 1 mM MgCl2) was added to the well plate 144 to maintain cell's living environment, which also served as a buffer solution in the experiment. To drive and record the GISFET's sensing current, a source measure unit 140 (Keysight B2900A) tethered to a control PC 142 for data analysis was connected to the reference electrode and two electrodes on the GISFET 101. The ion-selective field effect transistor (ISFET) chip 100 of the GISFET 101 was in contact with the solution 152 as shown.

Figure 10:
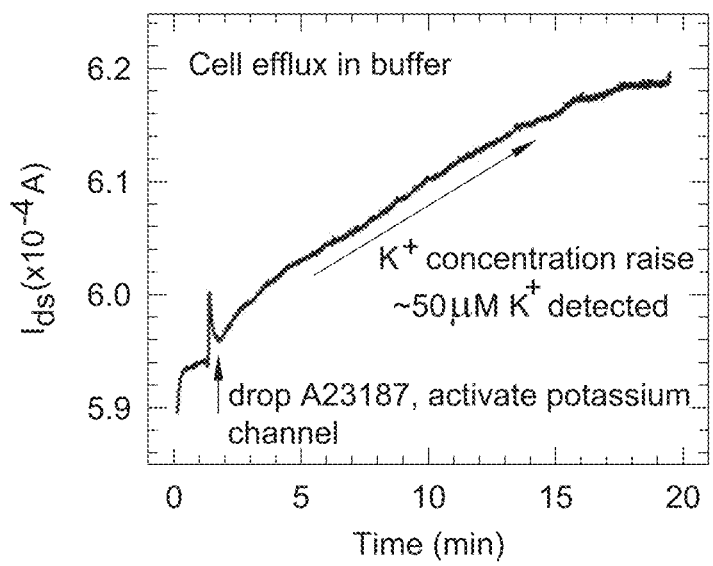
FIG. 10 is a graph illustrating the increase in current over time after activation of $K^+$ ion efflux from cells, where calibration data can then be used to calculate the $K^+$ concentration from the GISFET device of the present invention.

Referring now to FIG. 10, after about 2 minutes of stabilization of the GISFET 101 in the buffer solution 152 in the well plate 144, the A23187 activating chemical was added to the well plate 144, which caused a consistent increase in current for about 20 minutes thereafter. The increasing current indicates the T84 cells' $K^+$ ion efflux from the NSC channel in fact activated by A23187. By calculating the $K^+$ concentration based on the calibration data, the $K^+$ concentration could then be determined to be about 50 uM. The value generally corresponds to earlier reports where a commercial ISFET and traditional patch clamp technique were used to determine $K^+$ concentration, thus showing the feasibility of the GISFET of the present invention to be used in cell-based applications.

Figure 11A:
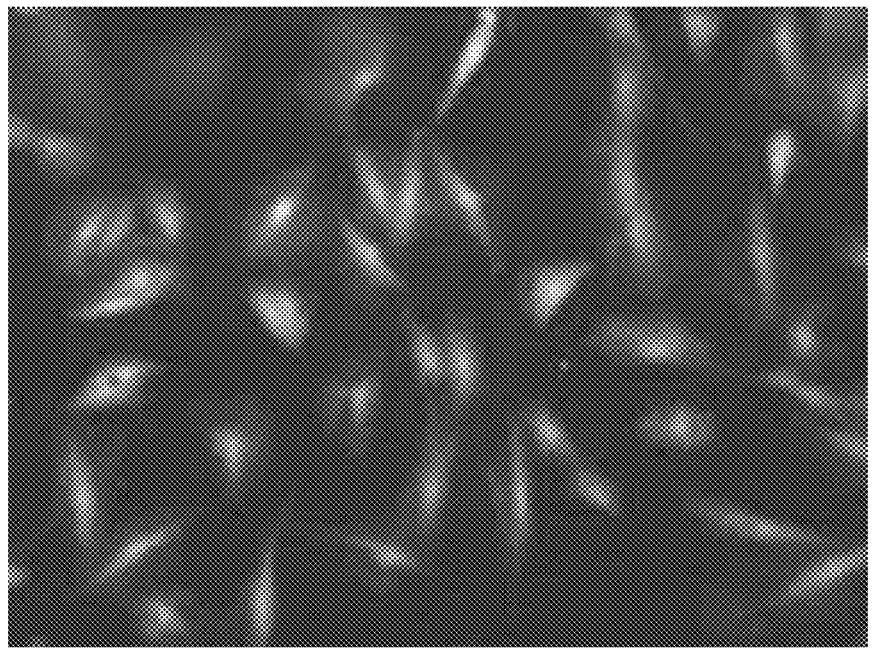
FIG. 11*a* is an image showing the presence of cells grown on an uncoated glass coverslip as visualized via the fluorescent dye calcein-AM.
Figure 11B:
FIG. 11b is an image showing the presence of cells grown on graphene-coated coverslip as visualized via the fluorescent dye calcein-AM.

In addition, FIG. 11a is an image showing the presence of cells grown on an uncoated glass coverslip as visualized via the fluorescent dye calcein-AM, while FIG. 11b is an image showing the presence of cells grown on graphene-coated coverslip as visualized via the fluorescent dye calcein-AM. As shown from a comparison between the two images, the cells 150 appear to grow normally in culture on the graphene-coated glass coverslips 148, where no viability or morphological differences could be found when compared to cells grown directly on a glass coverslip not coated with graphene. This means that cells can be cultured directly on the GISFETs of the present invention in order to detect ions such as $K^+$ for drug screening assays, toxicity assays, etc. in an environment that does not negatively impact the cells compared to their natural environment.

Example 3

Figure 12:
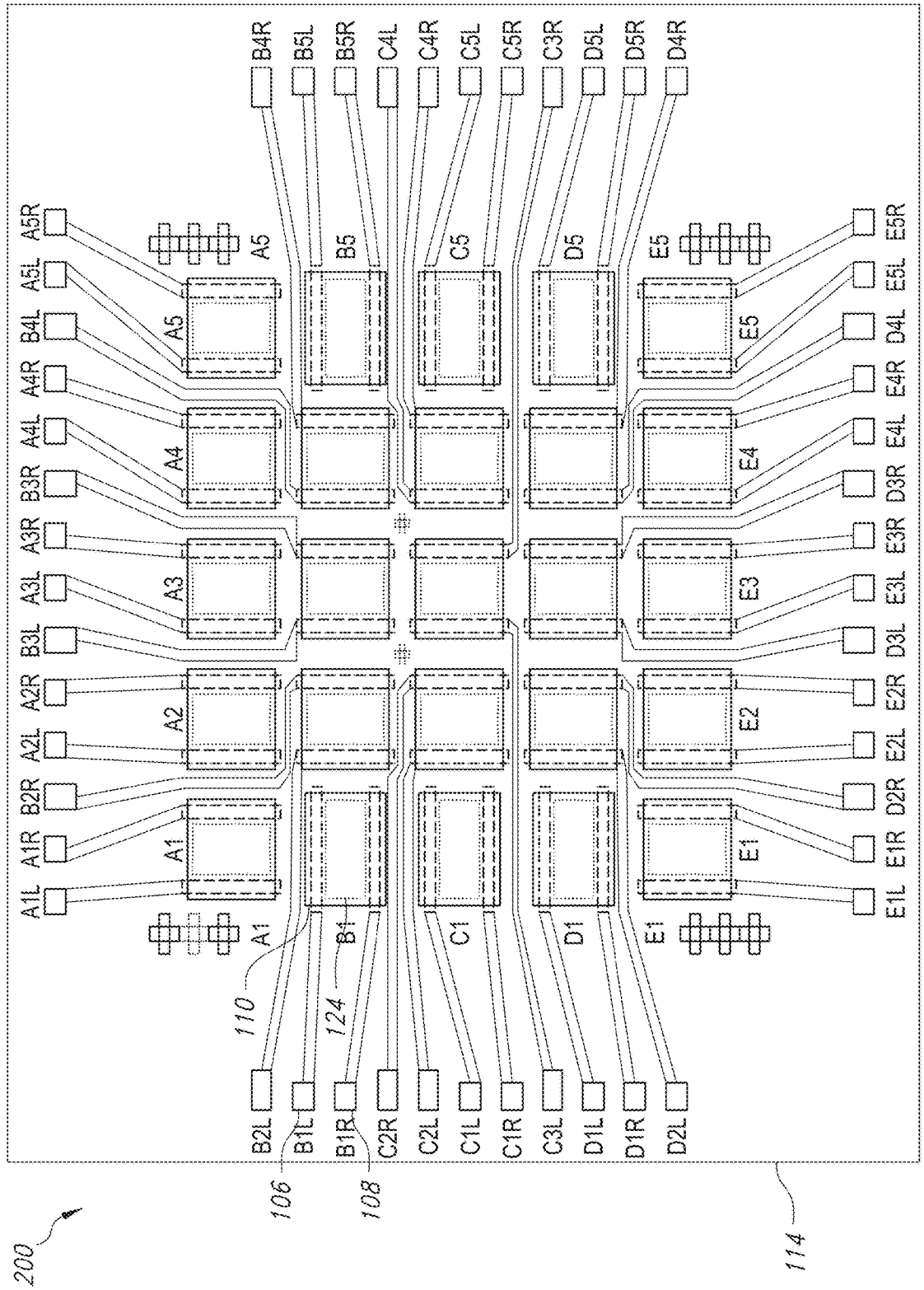
FIG. 12 is a top view schematic of an array containing a plurality of GISFETs as contemplated by the present invention, where the array enables testing of a variety of parameters.

In Example 3, the feasibility of forming an array of GISFETs was evaluated, where such an array could be used to run multiple assays on a testing solution contained in a single reservoir. FIG. 12 is a top view of an array 200 containing a plurality of GISFETs contemplated by the present invention. As shown, the array 200 can include a PCB 114 containing a plurality of GISFETs, where each GISFET has its own source contact 106 and drain contact 108 which can be disposed on a graphene film to form a graphene channel 110 that can define a sensing window 126 as described in detail above. Further, although not shown in the array 200, it is to be understood that the array can include an ion selective membrane 112 that is disposed above the graphene channel 110 and can include a single ionophore specific to the ion to be detected, a corresponding lipophilic salt, and a polymer. In addition, the active sensing window 126 for receiving a test solution to be detected for its ion concentration or any other parameter to be tested is formed by encapsulating each GISFET in the array 200 with an encapsulant material 124 but ensuring that the active sensing area 126 is exposed and not coated with the encapsulating material 124.

Figure 13A:
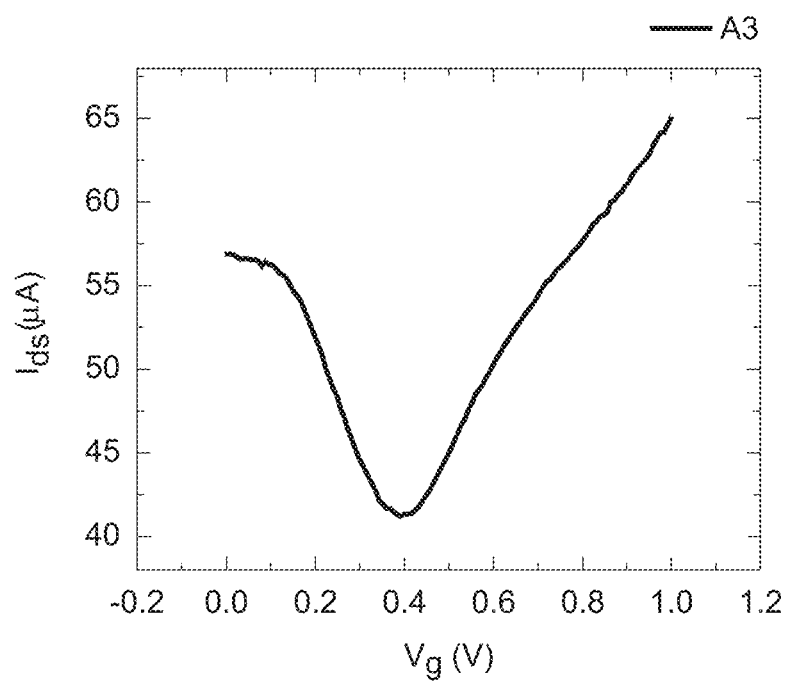
FIG. 13a is a graph illustrating the $I_d$-$V_g$ of the GISFET A3 shown in FIG. 12.
Figure 13B:
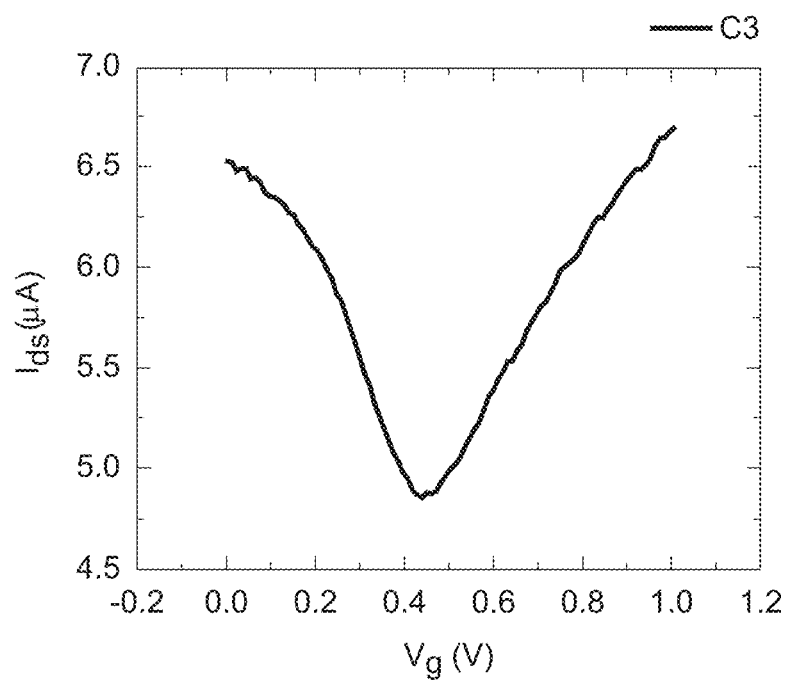
FIG. 13b is a graph illustrating the $I_d$-$V_g$ of the GISFET C3 shown in FIG. 12.
Figure 13C:
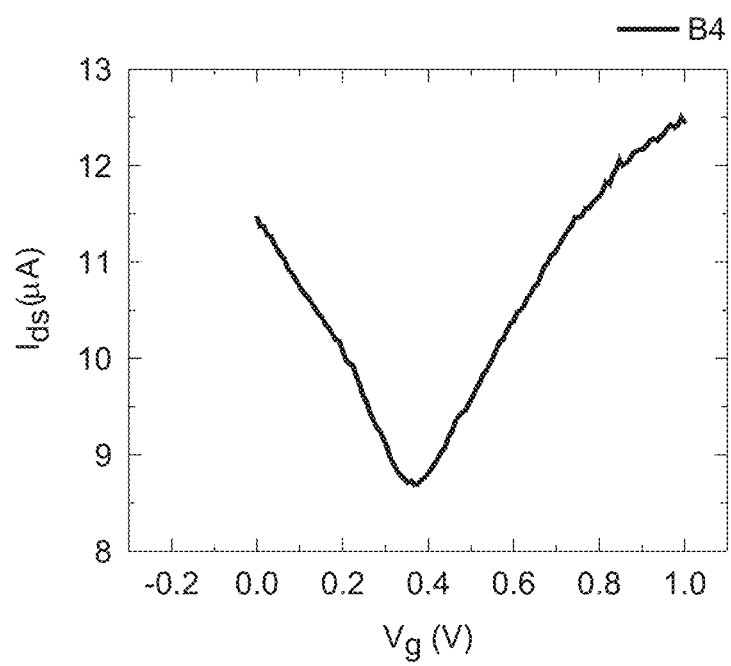
FIG. 13c is a graph illustrating the $I_d$-$V_g$ of the GISFET B4 shown in FIG. 12.

As shown in FIG. 12, the array 200 can include 25 GISFETS (e.g., A1 through E5 as shown in FIG. 12), where the array 200 can be contacted with a test solution such as test solution 152 described in Example 2, where each GISFET in the array 200 can test for a different parameter or electrical characteristic. For instance, FIG. 13a is a graph illustrating the $I_d$-$V_g$ of the GISFET A3 shown in FIG. 12, FIG. 13b is a graph illustrating the $I_d$-$V_g$ of the GISFET C3 shown in FIG. 12, and FIG. 13c is a graph illustrating the $I_d$-$V_g$ of the GISFET B4 shown in FIG. 12. Additionally or alternately, the array can enable mapping out the K$^+$ ion spatial concentration variation in real time.

Further, although 25 GISFETs are shown in the array of FIG. 12, it is to be understood that the array can include at least two and to up to about 100 GISFETs, and any number of ranges therebetween, such as from 2 to 50 GISFETS, from 3 to 40 GISFETs, etc. The embodiments of the invention described above are intended to be exemplary only. The scope of the invention is therefore intended to be limited solely by the scope of the appended claims.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

What is claimed:

1. A graphene ion selective field effect transistor comprising:
   a substrate;
   a graphene film disposed on the substrate; and
   an ion selective membrane disposed on the graphene film, wherein the ion selective membrane comprises an ionophore, a lipophilic salt, and a polymer; the polymer being a block copolymer having a continuous amorphous phase and a discontinuous crystalline phase and having a molecular weight ranging from about 100,000 Daltons to about 200,000 Daltons.

2. The graphene ion selective field effect transistor of claim 1, wherein the polymer has a glass transition temperature ranging from about −20° C. to about −60° C.

3. The graphene ion selective field effect transistor of claim 1, wherein the continuous amorphous phase comprises n-butyl acrylate and the discontinuous crystalline phase comprises methyl methacrylate.

4. The graphene ion selective field effect transistor of claim 3, wherein the n-butyl acrylate is present in the polymer in an amount ranging from about 82 wt.% to about 97.5 wt.% and the methyl methacrylate is present in the polymer in an amount ranging from about 2.5 wt.% to about 18 wt.%.

5. The graphene ion selective field effect transistor of claim 1, wherein the ion selective membrane is selective for potassium ions, sodium ions, calcium ions, or cadmium ions.

6. The graphene ion selective field effect transistor of claim 5, wherein the ion selective membrane is selective for potassium ions.

7. The graphene ion selective field effect transistor of claim 6, wherein the ionophore comprises valinomycin.

8. The graphene ion selective field effect transistor of claim 1, wherein the lipophilic salt comprises potassium tetrakis (4-chlorophenyl) borate (K-TCPB), sodium tetrakis (4-fluorophenyl) borate, sodium tetraphenyl borate, ammonium tetrakis (chlorophenyl) borate, or a combination thereof.

9. The graphene ion selective field effect transistor of claim 1, wherein the ionophore is present is present in an amount ranging from about 0.5 wt.% to about 4 wt.% of the total weight of the ion selective membrane.

10. The graphene ion selective field effect transistor of claim 1, wherein the lipophilic salt is present in an amount ranging from about 0.1 wt.% to about 0.5 wt.% of the total weight of the ion selective membrane.

11. The graphene ion selective field effect transistor of claim 1, wherein the polymer is present in an amount ranging from about 95 wt.% to about 99 wt.% of the total weight of the ion selective membrane.

12. The graphene ion selective field effect transistor of claim 1, wherein the ion selective membrane has a thickness ranging from about 0.25 micrometers to about 20 micrometers.

13. The graphene ion selective field effect transistor of claim 1, further comprising a source contact and a drain contact, wherein the substrate, the graphene film, the source contact, and the drain contact are encapsulated, leaving a portion of the ion sensitive membrane exposed for receiving a test solution.

14. The graphene ion selective field effect transistor of claim 1, wherein the graphene ion selective field effect transistor is stable for at least two months.

15. The graphene ion selective field effect transistor of claim 1, wherein the graphene ion selective field effect transistor detects ions at concentrations ranging from about 0.5 micromolar to about 20 millimolar.

16. The graphene ion selective field effect transistor of claim 1, wherein the graphene ion selective field effect transistor exhibits an ion sensitivity of at least about 50 millivolts/decade.

17. The graphene ion selective field effect transistor of claim 1, wherein the substrate comprises silicon polyethylene terephthalate (PET), polyethylene naphthalate (PEN), polyether ether ketone (PEEK), polyimide (PI), or a combination thereof.

18. An ion sensing device comprising the graphene ion selective field effect transistor of claim 1, wherein the graphene ion selective field effect transistor is mounted onto a printed circuit board.

19. An array comprising at least two of the graphene ion selective field effect transistor of claim 1.

20. A method of forming the graphene ion selective field effect transistor of claim 1, the method comprising:
positioning the graphene film on the substrate;
depositing a source contact and a drain contact on the graphene film;
coating a solution containing the ionophore, the lipophilic salt, and the polymer onto the graphene film to form the ion selective membrane, wherein the polymer is the block copolymer having the continuous amorphous phase and the discontinuous crystalline phase and having the molecular weight between 100,000 Daltons and 200,000 Daltons; and encapsulating the graphene ion selective field effect transistor such that a portion of the ion selective membrane is exposed.

* * * * *